(12) United States Patent
Zhang et al.

(10) Patent No.: US 11,095,279 B2
(45) Date of Patent: Aug. 17, 2021

(54) GENERALIZED PULSE WIDTH MODULATION TECHNIQUE FOR SPECIFIC INTER-HARMONICS CONTROL OF THE INVERTERS

(71) Applicant: WUHAN UNIVERSITY, Hubei (CN)

(72) Inventors: Hui Zhang, Hubei (CN); Yigang He, Hubei (CN); Kaipei Liu, Hubei (CN); Yuzheng Guo, Hubei (CN); Yongguang Cheng, Hubei (CN); Jie Xie, Hubei (CN); Lei Xu, Hubei (CN); Jintao Zhou, Hubei (CN); Yuanzhe Ge, Hubei (CN); Qizhen Li, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 16/867,575

(22) Filed: May 6, 2020

(65) Prior Publication Data
US 2020/0285130 A1    Sep. 10, 2020

(30) Foreign Application Priority Data

Mar. 6, 2019 (CN) .......................... 201910168261.7

(51) Int. Cl.
*H03K 7/08* (2006.01)
*G02F 1/37* (2006.01)

(52) U.S. Cl.
CPC .................. *H03K 7/08* (2013.01); *G02F 1/37* (2013.01)

(58) Field of Classification Search
CPC .................................. H03K 7/08; G02F 1/37
See application file for complete search history.

(56) References Cited

U.S. PATENT DOCUMENTS

| 5,923,550 | A  | * | 7/1999 | Kumar     | H02M 7/1626 363/69 |
| 7,209,064 | B1 | * | 4/2007 | Gaboriau  | H03M 3/358 341/152 |
| 7,724,548 | B2 | * | 5/2010 | Jones     | H02M 5/4585 363/37 |
| 10,582,962 | B2 | * | 3/2020 | Friedrichs | H02M 7/5395 |

* cited by examiner

*Primary Examiner* — Daniel Petkovsek
(74) *Attorney, Agent, or Firm* — JCIPRNET

(57) ABSTRACT

This disclosure provides a PSR-PWM technique for high power active front-end inverters to damp a specific inter-harmonic that may cause relative sub-synchronous resonance in power system. Due to the strong interaction between wind power converters, photovoltaic converters, FACTS devices and HVDC transmission, low-frequency oscillations occur from a few Hz to dozens of Hz, or even high-frequency oscillations ranging from about 300-2000 Hz. Meanwhile, low-frequency oscillations ranging from 0.6 Hz to 7 Hz occur in the power supply systems of many electric locomotives. Even in the case of large-scale train outage, low-frequency oscillation will lead to abnormal locomotive dispatching system; in addition, the power grid voltage disturbance and flicker caused by a large number of high-power are furnaces and other nonlinear loads in the industrial field with a passband inter-harmonic frequency ranging from 0.05 Hz-90 Hz and so on are detected.

15 Claims, 20 Drawing Sheets

| Type | Sub-cycle | Frequency control range $\Delta f$ (Hz) | | Num. of sub-cycles $r$ | $\Delta\theta$ | Control line in FIG.6 |
|---|---|---|---|---|---|---|
| | | In theory | Valid range | | | |
| A | $T$ | [-25, 0] | [-6.25, 0] | $r_T$ | $-\Delta\theta_T$ | Line 611 |
| | $T/6$ | [-25, -50] | [-37.5, 0] | $r_{T/6}$ | $-\theta_{T/6}$ | Line 621 |
| | $T/12$ | [-25, -50] | [-50, 0] | $r_{T/12}$ | $-\Delta\theta_{T/12}$ | Line 631 |
| B | $T$ | [0, 25] | [0, 6.25] | $r_T$ | $\Delta\theta_T$ | Line 612 |
| | $T/6$ | [0, 50] | [0, 37.5] | $r_{T/6}$ | $\Delta\theta_{T/6}$ | Line 622 |
| | $T/12$ | [0, 50] | [0, 50] | $r_{T/12}$ | $\Delta\theta_{T/12}$ | Line 632 |
| | Type A/B: clockwise phase angle modulation A/counterclockwise phase angle modulation B $r$: Number of modulated sub-cycles for PSR-PWM $\Delta\theta$: Phase angle increment | | | | | |

FIG. 22

| K | $f_{ih}$ $f_{ihb}$ (Hz) | $f_h$ (Hz) | $\Delta f = |f_{ih} - f_h|$ (Hz) | $r_k = m\frac{f_h}{\Delta f}$ | $\Delta\theta_{ih} = \frac{180°}{r_k}$ | $\theta'_{ih}$ | $\delta_{ih} = \theta'_{ih} - \theta_{ih}$ | $U_{ih}(V)$ | $M_{fih}$ | $\lambda_{ihb} = \frac{M_{fih}}{0.8666}$ | $f_{h\text{-}p} = 50ma\,m\,f_{ih}$ | |
|---|---|---|---|---|---|---|---|---|---|---|---|---|
| T(m=1) | 45 | 50 | 5 | 10 | 18° | 18.0162° | 0.0162° | 55.6856 | 0.8747 | 1.0101 | 50am45 | |
| T/6 | 5 | 50 | 45 | $6 \cdot \frac{50}{50-5} = \frac{60}{9}$ | $\frac{180°}{60/9} = 27°$ | 27.0149° | -0.0149° | 54.5447 | 0.8568 | 0.9894 | 300am5 | FIG.15 |
| | 18.4 | 50 | 31.6 | 750/79 | 18.96° | 19.1371° | 0.1771° | 55.5284 | 0.8722 | 1.0072 | 300am18.4 | |
| | 84.6 | 50 | 34.6 | 1500/173 | -20.76° | -20.5768° | 0.1832° | 55.3246 | 0.8690 | 1.0035 | 300am84.6 | |
| | 675 | 650 | 25 | 12 | -15° | -14.7665° | 0.2335° | 55.9139 | 0.8783 | 1.0142 | 300am675 | |
| | 875 | 850 | 25 | 12 | -15° | -14.6288° | 0.3712° | 55.9086 | 0.8782 | 1.0141 | 300am875 | |
| T/12 | 5 | 50 | 45 | $12 \cdot \frac{50}{50-5} = \frac{120}{9}$ | $\frac{180°}{120/9} = 13.5°$ | 13.5154° | -0.015° | 56.0910 | 0.8568 | 0.9894 | 600am5 | FIG.16 |
| | 18.4 | 50 | 31.6 | 1500/79 | 9.48° | 9.6606° | 0.1806° | 56.2981 | 0.8843 | 1.0212 | 600am18.4 | |
| | 84.6 | 50 | 34.6 | 3000/173 | -10.38° | -10.198° | 0.1820° | 56.2468 | 0.8835 | 1.0202 | 600am84.6 | |
| | 675 | 650 | 25 | 24 | -7.5° | -7.2612° | 0.2388° | 56.4056 | 0.8860 | 1.0231 | 600am675 | |
| | 875 | 850 | 25 | 24 | -7.5° | -7.2717° | 0.2283° | 56.3814 | 0.8856 | 1.0227 | 600am875 | |

Information of initial values for modulated characteristic harmonics: $\theta_{ih} = 0°$; $f_{ih1} = 50$Hz; $f_{ih2} = 650$Hz; $f_{ih3} = 850$Hz; $U_{dc} = 100$V for a three-phase inverter DC-link voltage source; $f_{ihb}$ for a desired inter-harmonic frequency; $r_k$ for a number of modulated sub-cycles, the subscript K presenting the different type of modulation method with different modulated sub-cycle with $T$, $T/6$, $T/12$.

FIG. 23

GENERALIZED PULSE WIDTH MODULATION TECHNIQUE FOR SPECIFIC INTER-HARMONICS CONTROL OF THE INVERTERS

CROSS-REFERENCE TO RELATED APPLICATION

This application claims the priority benefit of China application serial no. 201910168261.7, filed on Mar. 6, 2019. The entirety of the above-mentioned patent application is hereby incorporated by reference herein and made a part of this specification.

BACKGROUND

Technical Field

The invention relates to the field of inter-harmonic detection and suppression in power systems, in particular the selective control of amplitude and phase of inter-harmonics based on phase modulation.

Description of Related Art

The existing research of PWM technology applied in high-power inverter mainly carries out on harmonics. Harmonic current compensation control can be summarized into two types: non-selective harmonic compensation and selective harmonic compensation. Non-selective harmonic compensation means that the harmonic compensation command of the current controller is derived from the residual harmonic extracted from the fundamental wave. The selective harmonic compensation is realized by detecting the specific harmonic to compensate respectively. Targeted treatment of the most harmful low-order harmonics can effectively improve power quality. In view of the current research gap in the direct control of the inter-harmonic amplitude modulation and the phase modulation where inverters serve as the adjustment link, it is proposed to further modulate the obtained PWM modulation waveform by using the optimized pulse waveform method based on the partial asymmetric switching angle to make the inverter produces the specific inter-harmonics required. The invention is applied to the field of front-end power system harmonic control. The control algorithm is simple and precise.

SUMMARY

The invention provides a theoretical analysis on a time-shift and phase-shift characteristic of signals, which can generate a frequency spectrum offset of the signal in order to transfer a specific signal spectrum to a desired frequency spectrum of the inter-harmonic signal. Then this disclosure demonstrates a phase-shifted rotating (PSR) pulse width modulation (PWM) technique to control a specific inter-harmonic in multiple sub-cycles for inverters based this theoretical analysis directly. Similarly, two kinds of modulation for phase angles may be defined by clockwise and counter-clockwise separately, and each kind still provides three methods with different modulation sub-cycles, T, T/6, T/12 separately. The frequency control range of specific inter-harmonics control are demonstrated, and the maximum frequency spectrum offset ranging from −50 Hz to 50 Hz for a specific characteristic harmonic to a needed desired specific inter-harmonic is provided for grid-connected inverters. Therefore, the inverter behaves as a controlled voltage source by one or several inter-harmonic voltage sources simultaneously. The principal of this disclosure is suitable for any kind of existing PWM methods which control the characteristic harmonic according to its amplitude and phase angle, such as Sinusoid PWM (SPWM), Space Vector PWM (SVPWM), WPWM (Wavelet PWM) and so on.

This provided PSR-PWM technique can quickly and accurately suppress specific sub-harmonics and inter-harmonics in the power grids; and it is helpful to damp the relative sub-synchronous oscillation and high-frequency oscillation in these power grids.

It is found the following 2 characteristics of an inter-harmonic controlled by two kinds of modulation phase angle increments, namely clockwise phase angle modulation (type A) and counter-clockwise phase angle modulation (type B) in this disclosure.

(1) Obtain a minus frequency spectrum shift by clockwise phase angle increment;

(2) Obtain a plus frequency spectrum shift by counter-clockwise phase angle increment;

Technical solutions to implement the PWM method for inter-harmonics control are as followings:

(1) Given the frequency, amplitude, and initial phase of a desired inter-harmonic signal;

(2) Select the adjacent frequency spectrum of a characteristic harmonic based on the desired inter-harmonic frequency spectrum, and calculate the frequency offset;

(3) According to the frequency offset, select a type of sub-cycle and calculate the number of the type of a number value r;

(4) Determine counterclockwise phase angle modulation B if the frequency of desired inter-harmonic is greater than the selected nearest adjacent frequency of the characteristic harmonic, otherwise determine clockwise phase angle modulation A.

(5) Extending the modulated waveform so the length of total modulation period is rT (T is the fundamental period). The phase angle of the characteristic harmonic signal in each sub-cycle is linearly modulated.

The selected fundamental wave and characteristic harmonics may be modulated by the PSR-PWM technique to generate a desired specific inter-harmonic by an inverter.

Further, when the desired frequency spectrum offset is large, using one fundamental period as one sub-cycle of modulation are not so effective because the voltage amplitude modulation degree is relatively low and the components of the remaining parasitic frequency are relatively high, meanwhile, the total modulation period needs relative too long time, it is difficult for meeting the requirements of response speed in a control system.

Further, in order to improve the voltage modulation degree, to extend the frequency control range of a specific inter-harmonic as large as possible, and to decrease the less modulated total period than that of PSR-PWM based T as a modulated sub-cycle, the PSR-PWM based T/6 as a modulated sub-cycle can be adopted, called T/6 modulation in the following in short. The principle of the T/6 modulation method is that one-sixth of the fundamental period as a modulated sub-cycle according to the main idea of the proposed PSR-PWM technique.

Further, the PSR-PWM based T/12 as a modulated sub-cycle can be adopted, called T/12 in the following in short. Similarly, the principle of the T/12 modulation method is that one-twelfth of the fundamental period as a modulated sub-cycle, and so forth.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 22 is TAB.1 showing diagram of relationship between frequency control range from the $h^{th}$ characteristic harmonics to desired inter-harmonics and variable r as the number of modulated sub-cycles.

FIG. 23 is TAB.2 showing overview of basic characteristic of PSR-PWM based typical simulation cases.

DESCRIPTION OF THE EMBODIMENTS

Figure 1:
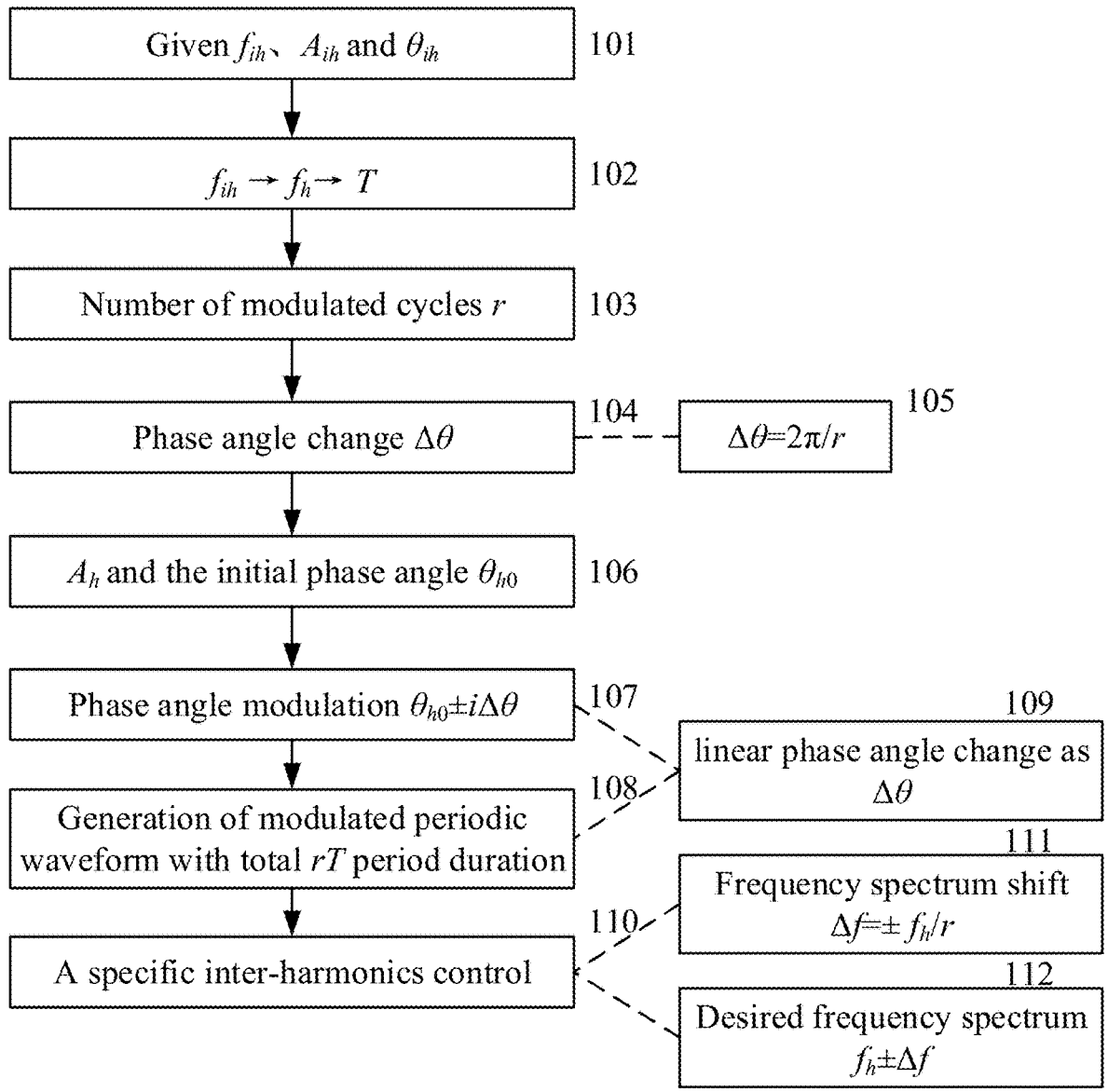
FIG. 1 is a flowchart of the specific inter-harmonics PWM method.

FIG. 1 is the schematic diagram of flow chart of specific inter-harmonics PWM control, where the symbol subscript ih represents the inter-harmonics parameter, the symbol subscript h represents the harmonic parameter, f represents the frequency, A represents the amplitude, θ represents the harmonic phase angle, Δθ represents the phase angle increment, and i is the modulation cycles index. The left part is the frequency, amplitude, and phase angle information of the given inter-harmonics; the nearest adjacent characteristic harmonics are selected as participating modulation harmonics and determining the relevant spectrum offset to determine the total number of fundamental wave sub-cycles r.

(1) In 101, given a specific inter-harmonic with the information as frequency $f_{ih}$, amplitude $A_{ih}$ and phase $\theta_{ih}$;

(2) In 102,103,104,105, selected the characteristic harmonic frequency $f_h$ that is nearest adjacent to the desired $f_{ih}$, determine the way of phase angle modulation, clockwise A or counterclockwise B, the number of fundamental sub-cycles r, calculate the total period rT, and the phase angle increment Δθ.

(3) In 106, calculate the amplitude $A_h$ and the initial phase angle of the first sub-cycle $\theta_{h0}$.

(4) In 107 and 108, within the selected total fundamental period rT (r∈Z), control the initial phase angle to change linearly from one fundamental period to the next fundamental period, and the amplitude to remain unchanged to generate a new modulation waveform with a period of rT with a frequency offset of Δf, $\Delta f = f_{ih} - f_h$;

(5) In 109, extending the modulated waveform with a period of rT.

(6) In 110,111,112, the selected fundamental wave and harmonics are modulated by the PWM method to generate the desired specific inter-harmonics by the inverter.

Further, in step (2), $f_h$ is the closest adjacent characteristic harmonic frequency to the desired inter-harmonic $f_{ih}$, for example, if the desired inter-harmonic frequency is 255 Hz, 250 Hz signal should be chosen for the above modulation process.

Further, there are two modulation methods: clockwise modulation A and counterclockwise modulation B. The counterclockwise modulation B is defined by a linear increase of phase angle, and the clockwise modulation A is defined by linear reduction of phase angle. If the voltage signal frequency 50 Hz is shifted to 55 Hz, counterclockwise modulation B should be used; if the voltage signal frequency 50 Hz is shifted to 45 Hz, the clockwise modulation A should be used.

Further, for the sub-cycle of the modulation T, there are two kinds of frequency offset separately for series compensator and parallel compensator to be explained as the followings:

①One cycle of a certain harmonic is the modulation fundamental period, $T=1/f_h$. Select only one characteristic harmonic frequency $f_h$ that is closest adjacent to the desired inter-harmonic frequency $f_{ih}$, and then calculate the frequency offset $\Delta f=f_{ih}-f_h$. If $f_h$ can be divided by $\Delta f$, then the number of modulation sub-cycles $r_T$, and the phase angle increment $\Delta \theta_T$ can be calculated as the following:

$$r_T = f_h/\Delta f \quad (1)$$

$$\Delta \theta_T = 2\pi/r_T \quad (2)$$

If $f_h$ cannot be divided by $\Delta f$, supposed the irreducible fraction $f_h/\Delta f=m/n$ (m and n are coprime positive integers), the number of sub-cycles is $r_T=n$ and $\Delta \theta_T=2\pi \cdot n/m$, and step (5) should be extending the modulated waveform with a period of nT. Theoretically, the frequency control range of inter-harmonics can be from 0 to ∞Hz, namely the full frequency band for an ideal sinusoidal signal according to the proposed PWM method.

②Now one sub-cycle comprising the fundamental signal with 50 Hz and other characteristic harmonics, such as $5^{th}$ harmonic are controlled simultaneously as a modulation fundamental sub-cycle for inverter by PWM method, T=20 ms. Then the number of modulation sub-cycles r and the phase angle increment $\Delta\theta$ can be calculated as the following:

$$r_T = f_h/[(f_{ih}-f_h) \cdot h](r \in N) \quad (3)$$

$$\Delta \theta_T = 2\pi/r \quad (4)$$

It is shown that the calculation method of $\Delta\theta$ is the same as in ①, h is the order of the selected harmonic to be modulated. It is demonstrated that the frequency offset for fundamental and other characteristic harmonics are the same. If it is used 10 modulated fundamental sub-cycles to control sub-harmonics (less than 50 Hz) and super-harmonics (greater than 50 Hz and less than 100 Hz) by PWM, the frequency offset is 5 Hz, that is to say, the frequency offset of both $5^{th}$ harmonic and $7^{th}$ harmonic is 5 Hz, too.

Further, in step (3), the amplitude of the modulation waveform can be calculated by the formula as follows ($a \in Z$):

Amplitude characteristics of counterclockwise modulation:

$$|F_k| = \begin{cases} \frac{1}{2} \text{Sinc}\left[\left(1-\frac{1}{r_T}\right)\pi\right] & k=1 \\ \frac{1}{2}\left|\text{Sinc}\left[\left(a+\frac{1}{r_T}-1\right)\pi\right]\right| & k=ar_T+1 \ (a \geq 1) \\ \frac{1}{2}\left|\text{Sinc}\left[\left(a-\frac{1}{r_T}+1\right)\pi\right]\right| & k=ar_T-1 \ (a \geq 1) \end{cases} \quad (5)$$

Amplitude characteristics of clockwise modulation:

$$|F_k| = \begin{cases} \frac{1}{2} \text{Sinc}\left[\left(1+\frac{1}{r_T}\right)\pi\right] & k=1 \\ \frac{1}{2}\left|\text{Sinc}\left[\left(a+\frac{1}{r_T}+1\right)\pi\right]\right| & k=ar_T+1 \ (a \geq 1) \\ \frac{1}{2}\left|\text{Sinc}\left[\left(a-\frac{1}{r_T}-1\right)\pi\right]\right| & k=ar_T-1 \ (a \geq 1) \end{cases} \quad (6)$$

Where the function:

$$\text{Sinc}(x) = \frac{\sin(x)}{x};$$

Calculate the initial phase of the first modulated fundamental sub-cycle of the waveform, $\theta_0$, by these formulas:

Phase angle characteristics of counterclockwise modulation B of the inter-harmonic control:

$$\angle F_k(\theta_0) = \begin{cases} \left(1-\frac{1}{r_T}\right)\pi + \theta_0 & k=1 \\ -\frac{1}{r_T}\pi + \theta_0 & k=ar_T+1 \ (a \geq 1) \\ -\left(1-\frac{1}{r_T}\right)\pi - \theta_0 & k=ar_T-1 \ (a \geq 1) \end{cases} \quad (7)$$

Phase angle characteristics of clockwise modulation A of the inter-harmonic control:

$$\angle F_k(\theta_0) = \begin{cases} \frac{1}{r_T}\pi + \theta_0 & k=r_T-1 \\ -\frac{1}{r_T}\pi + \theta_0 & k=ar_T+1 \ (a \geq 0) \\ -\left(1-\frac{1}{r_T}\right)\pi + \theta_0 & k=ar_T-1 \ (a \geq 2) \end{cases} \quad (8)$$

Further, as for the T/6 modulation method, the closest adjacent characteristic harmonic $f_h$ is selected to control the desired inter-harmonic frequency $f_{ih}$, then calculate the frequency offset $\Delta f=f_{ih}-f_h$, determine the number of modulation sub-cycles of $r_{T/6}$ and phase angle increment $\Delta\theta_T/6$ according to these following formula:

$$r_{T/6} = (f_h/h\Delta f) \cdot 6 \quad (9)$$

$$\Delta\theta_{T/6} = 2\pi/r_{T/6} \quad (10)$$

Further, in step (4): The positive or negative phase angle increments are determined by the selected modulation method, and these phase angles are modulated linearly in $r_{T/6}$ sub-cycles. Then, extend the modulated waveform period with a cycle:

$$r_{T/6}/[(f_h/h) \cdot 6] \quad (11)$$

Figure 2A:
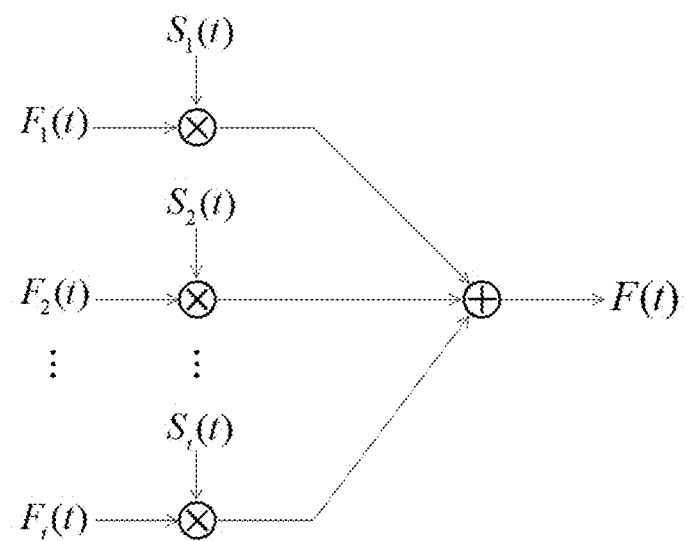
FIG. 2A and FIG. 2B are schematic diagrams of Modulated Signal diagram by using time windows and construction of total output cycle waveform with multi modulated sub-cycles.
Figure 2B:
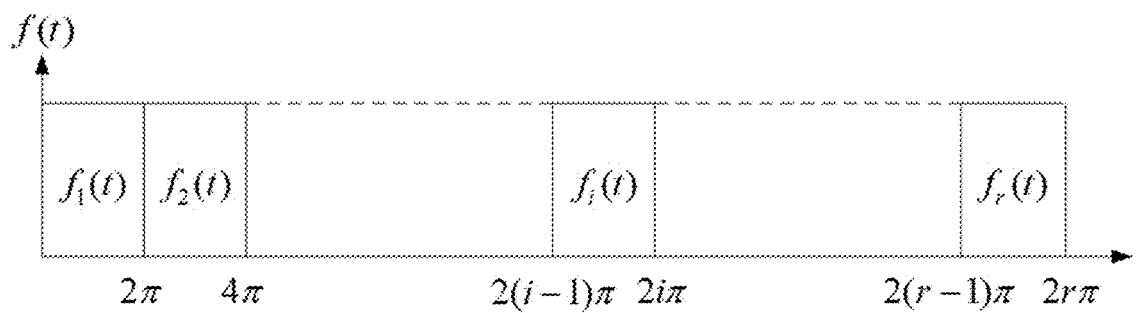

FIG. 2A and FIG. 2B show the composition of the modulated signal using time window function. Suppose the frequency of the sinusoidal signal f(t) is $f_0$, the period is T, the initial phase is $\theta_0$, and the amplitude $A_h$ is 1 p.u. Its expression is:

$$f(t) = A_h \cos(2\pi f_0 t + \theta_h) \quad (12)$$

Within r fundamental sub-cycle, then the modulated multi sub-cycle as total period is rT, the phase angle of the modulated signal is controlled to vary linearly, that is, the initial phase angle of the first fundamental sub-cycle is $\theta_0$, and the phase angle of the next fundamental sub-cycle is sequentially increased or decreased by $\Delta\theta$. In the space-vector rotation coordinate system, divide the periodic electrical angle $2\pi$ within r fundamental sub-cycle into r equal parts, $\Delta\theta=2\pi/r$. The counterclockwise modulation method B is defined by a linear increase of phase angle, and the clockwise modulation A is defined by linear reduction of phase angle. The counterclockwise modulated signal of the ith($1 \leq i \leq r$) sub-cycle is:

$$f_{ccw}(t,i) = \cos(2\pi f_0 t + \theta_0 + (i-1)\Delta\theta) \quad (13)$$

The clockwise modulated signal of the ith($1 \leq i \leq r$) sub-cycle is:

$$f_{cw}(t,i) = \cos(2\pi f_0 t + \theta_0 - (i-1)\Delta\theta) \quad (14)$$

Define time window function:

$$S_i(t) = \begin{cases} 1 & (i-1)T \leq t \leq iT \\ 0 & \text{otherwise} \end{cases} \quad (15)$$

The total counterclockwise modulation signal can be expressed as:

$$f_{ccw}(t) = \sum_{i=1}^{r} f_{ccw}(t,i) S_i(t) \quad (0 \leq t < rT) \quad (16)$$

The total clockwise modulation signal can be expressed as:

$$f_{cw}(t) = \sum_{i=1}^{r} f_{cw}(t,i) S_i(t) \quad (0 \leq t < rT) \quad (17)$$

This can be analyzed and explained by using a product of signals in time domain corresponding to the convolution of signals in frequency domain with double-variable Fourier series.

First analyze counterclockwise modulation method. Let the Fourier series of $f_{ccw}(t,i)$ and $S_i(t)$ be $F_{k,i}$ and $C_{k,i}$ respectively. The product of signals in time domain corresponds to the convolution of signals in frequency domain, so the Fourier series of $f_{ccw}(t)$ is:

$$F_k = \sum_{i=1}^{r} F_{k,i} \otimes C_{k,i} \quad (18)$$

The Fourier series of $F_{k,i}$ is:

$$F_{k,i}(t) = \begin{cases} \frac{1}{2} e^{j(i-1)\frac{2\pi}{r}} & i = r \\ \frac{1}{2} e^{-j(i-1)\frac{2\pi}{r}} & i = -r \\ 0 & \text{other} \end{cases} \quad (19)$$

$C_{k,i}$, the Fourier series of $S_i(t)$, can be calculated by the following equation:

$$C_{k,i} = \frac{1}{rT} \int_{(i-1)T}^{iT} e^{-jk\frac{\omega_0}{r}t} dt \quad (20)$$

The result is:

$$C_{k,i} = \frac{1}{r} e^{-j\frac{k\pi(2i-1)}{r}} \operatorname{Sinc}\left(\frac{k\pi}{r}\right) \quad (21)$$

Therefore, $F_{k,i} \otimes C_{k,i}$ should include two items:

$$F_{k,i} \otimes C_{k,i} = \sum_{m=-\infty}^{+\infty} F_{m,i} C_{k-m,i} = F_{-r,i} C_{k+r,i} + F_{r,i} C_{k-r,i} \quad (22)$$

The calculation results of these two items are:

$$F_{-r,i} C_{k+r,i} = \frac{1}{2r} \operatorname{Sinc}\left[\frac{(k+r)\pi}{r}\right] e^{-j\frac{\pi}{r}[2(k+1)i - (k+r+2)]} \quad (23)$$

$$F_{r,i} C_{k-r,i} = \frac{1}{2r} \operatorname{Sinc}\left[\frac{(k-r)\pi}{r}\right] e^{-j\frac{\pi}{r}[2(k-1)i - (k-r-2)]} \quad (24)$$

For $F_{r,i}C_{k-r,i}$, only when k=ar+1, the phase of $F_{r,i}C_{k-r,i}$ is equal from 1 to 6; when k≠ar+1, for each of the $k^{th}$ inter-harmonic components, the phase angle can cancel each other when the index of sub-cycle i changes from 1 to 6.

For $F_{-r,i}C_{k+r,i}$, only when k=ar−1, the phase of $F_{-r,i}C_{k+r,i}$ is equal from 1 to 6; when k≠ar−1, for each of the kth inter-harmonic components, the phase angle can also be canceled each other when the index of sub-cycle i changes from 1 to 6. In summary, the frequency component $F_k$ is not 0 only when k=ar±1.

Figure 3A:
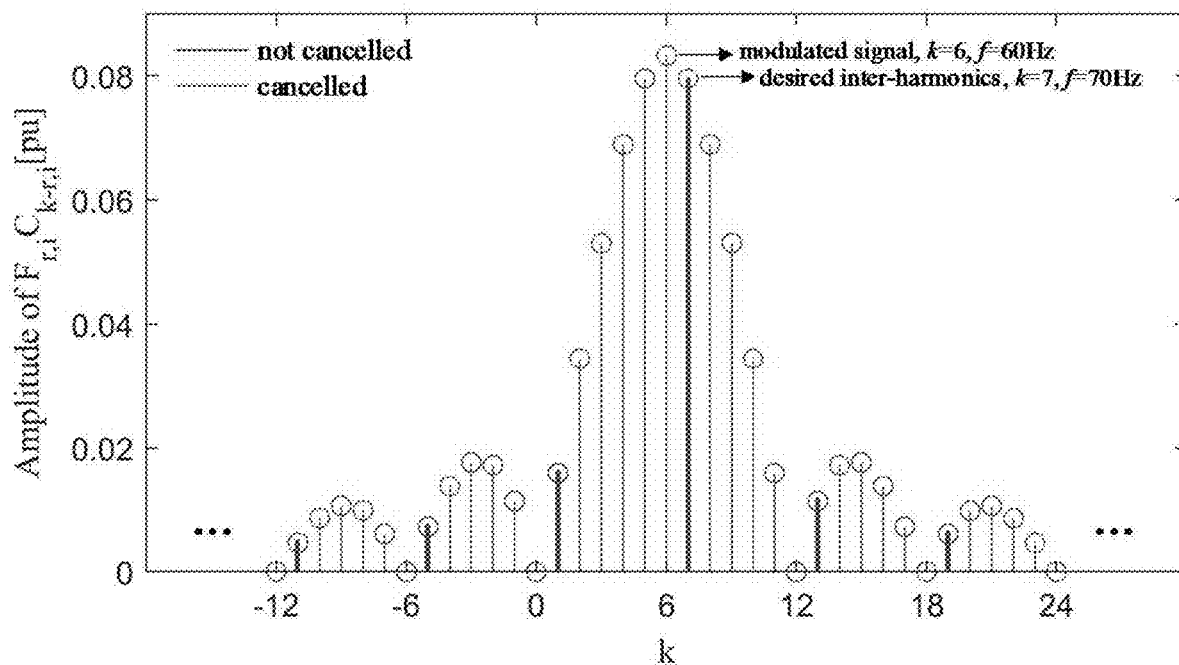
FIG. 3A and FIG. 3B are schematic diagrams of quantitative studies of inter-harmonic amplitudes by double-variables Fourier series as a function of inter-harmonic order k and modulation cycles index i.
Figure 3B:
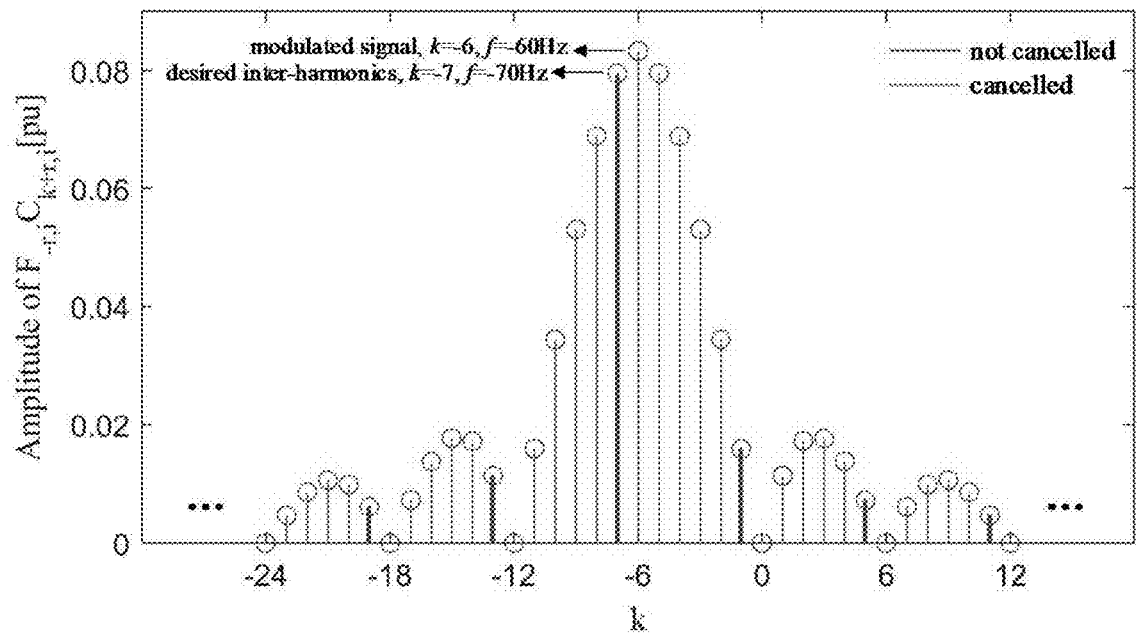

FIG. 3A and FIG. 3B show the amplitude of $F_{r,i}C_{k-r,i}$ and $F_{-r,i}C_{k+r,i}$ as a function of k and i (r=6) For example, considering that the grid frequency is 60 Hz and the number of sub-cycles is r=6, for a certain k and i, the distribution of harmonic signals during this period is described below: FFT analysis shows that when k varies from 0 to r, only the inter-harmonic component corresponding to k=1, 7, 13, ... (k=6a+1) (the corresponding frequencies are 10 Hz, 70 Hz, 130 Hz, ... ) of $F_{r,i}C_{k-r,i}$ is not cancelled. The other inter-harmonic frequency component corresponding to k=2, 3, 4, 5, 6, ... are suppressed because of the phase cancellation. The red lines indicate that the frequency component at that location will not be cancelled.

Figure 4A:
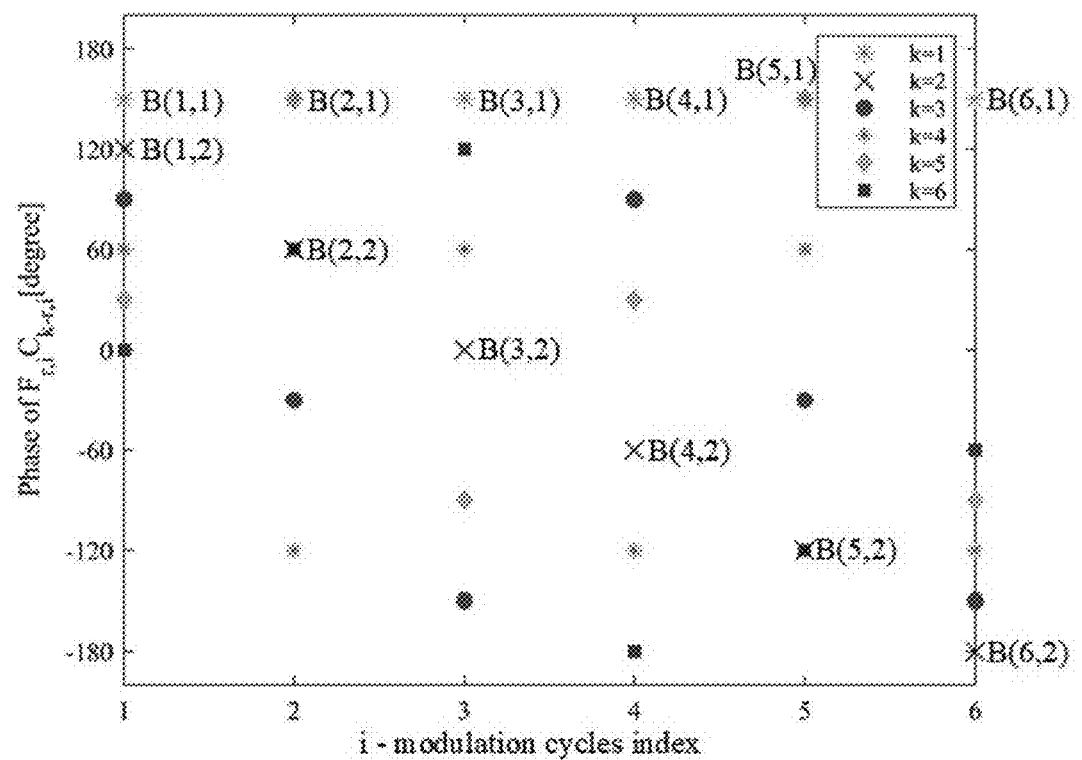
FIG. 4A and FIG. 4B are schematic diagrams of quantitative studies of inter-harmonic phase angles by Fourier series as a function of inter-harmonic order k and modulation cycles index 1.
Figure 4B:
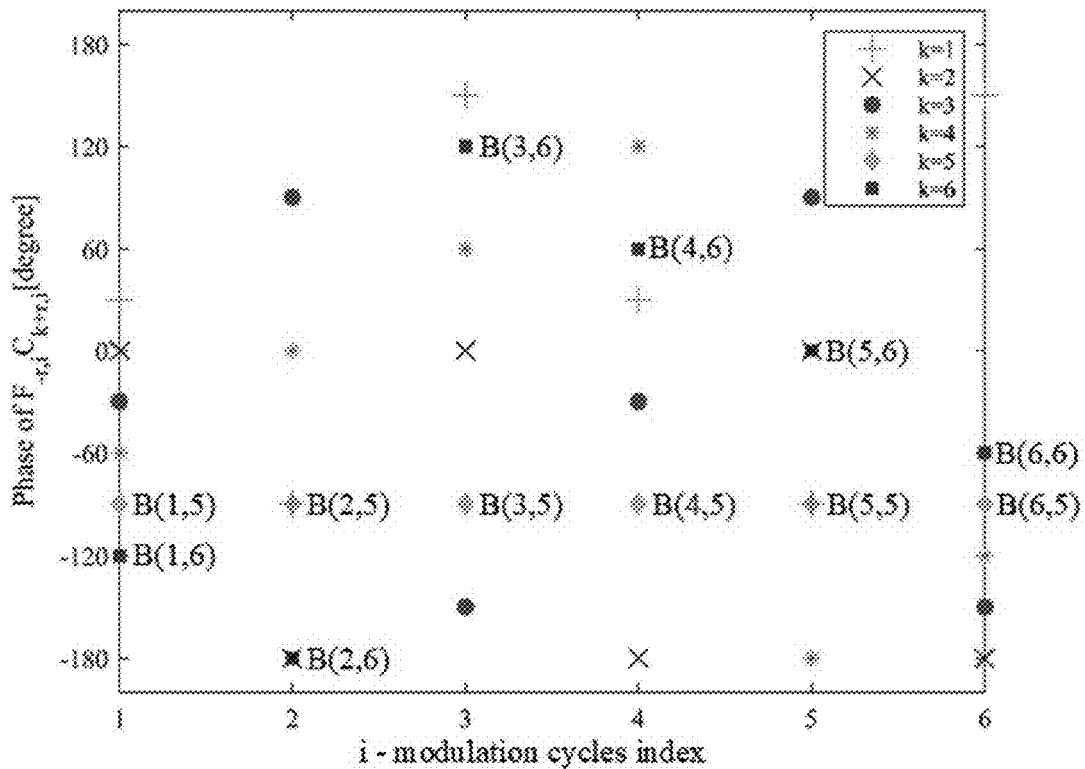
Figures 5A, 5B:
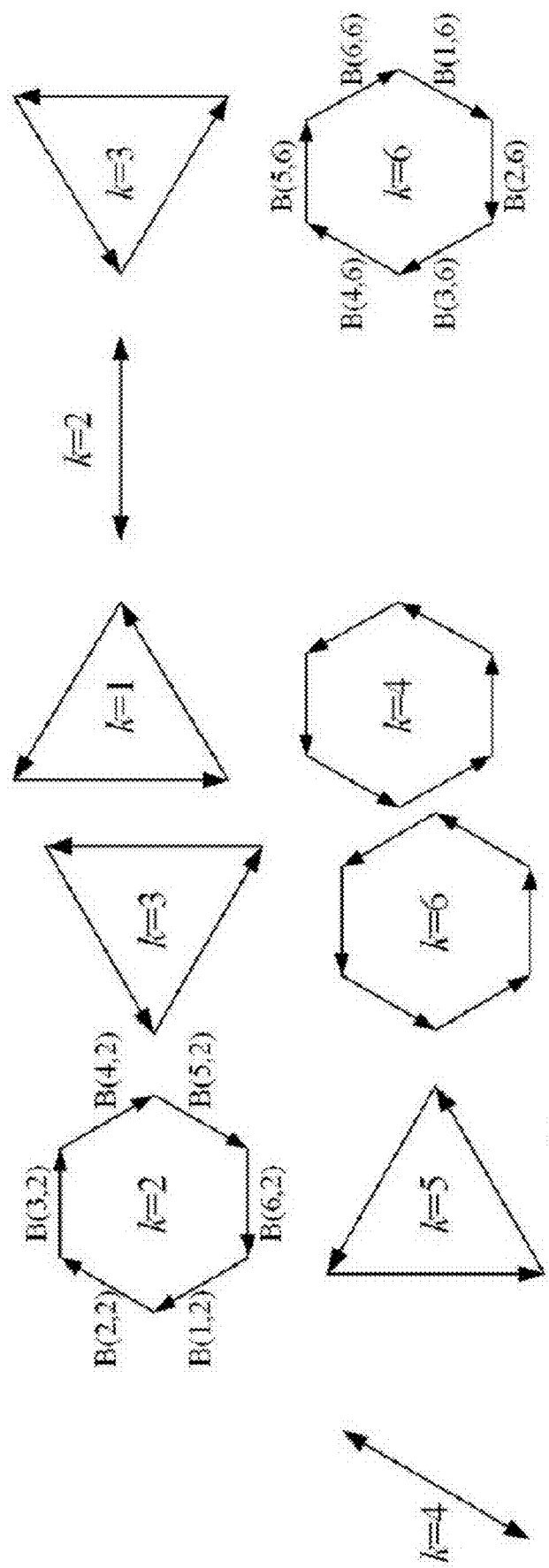
FIG. 5A and FIG. 5B are schematic diagrams of phase angle cancellations for parasitic inter-harmonic voltages according to the variables of the inter-harmonic order k and modulation sub-cycles index i.

FIG. 4A and FIG. 4B show the phase changes of $F_{r,i}C_{k-r,i}$ and $F_{-r,i}C_{k+r,i}$ for different i and k. Take k=2 as an example. When i changes from 0 to 6, the phase of $F_{r,i}C_{k-r,i}$ corresponds to B(1,2), B(2,2), B(3,2), B(4,2) B(5,2) and B(6,2) in FIG. 5A. Their phase angle vectors of the specific kth harmonic components are connected end-to-end to form a closed loop, therefore the 20 Hz inter-harmonic component corresponding to k=2 does not appear.

After further analysis, the amplitude characteristic of $F_k$ is:

$$|F_k| = \begin{cases} 0.5\operatorname{Sinc}[(1-1/r)\pi] & k = 1 \\ 0.5|\operatorname{Sinc}[(a-1+1/r)\pi]| & k = ar+1 \quad (a \geq 1) \\ 0.5|\operatorname{Sinc}[(a+1-1/r)\pi]| & k = ar-1 \quad (a \geq 1) \end{cases} \quad (25)$$

The phase characteristic of $F_k$ is:

$$\angle F_k = \begin{cases} (1-1/r)\pi + \theta_0 & k = 1 \\ (-1/r)\pi + \theta_0 & k = ar+1 \quad (a \geq 1) \\ -(1-1/r)\pi - \theta_0 & k = ar-1 \quad (a \geq 1) \end{cases} \quad (26)$$

Figure 6:
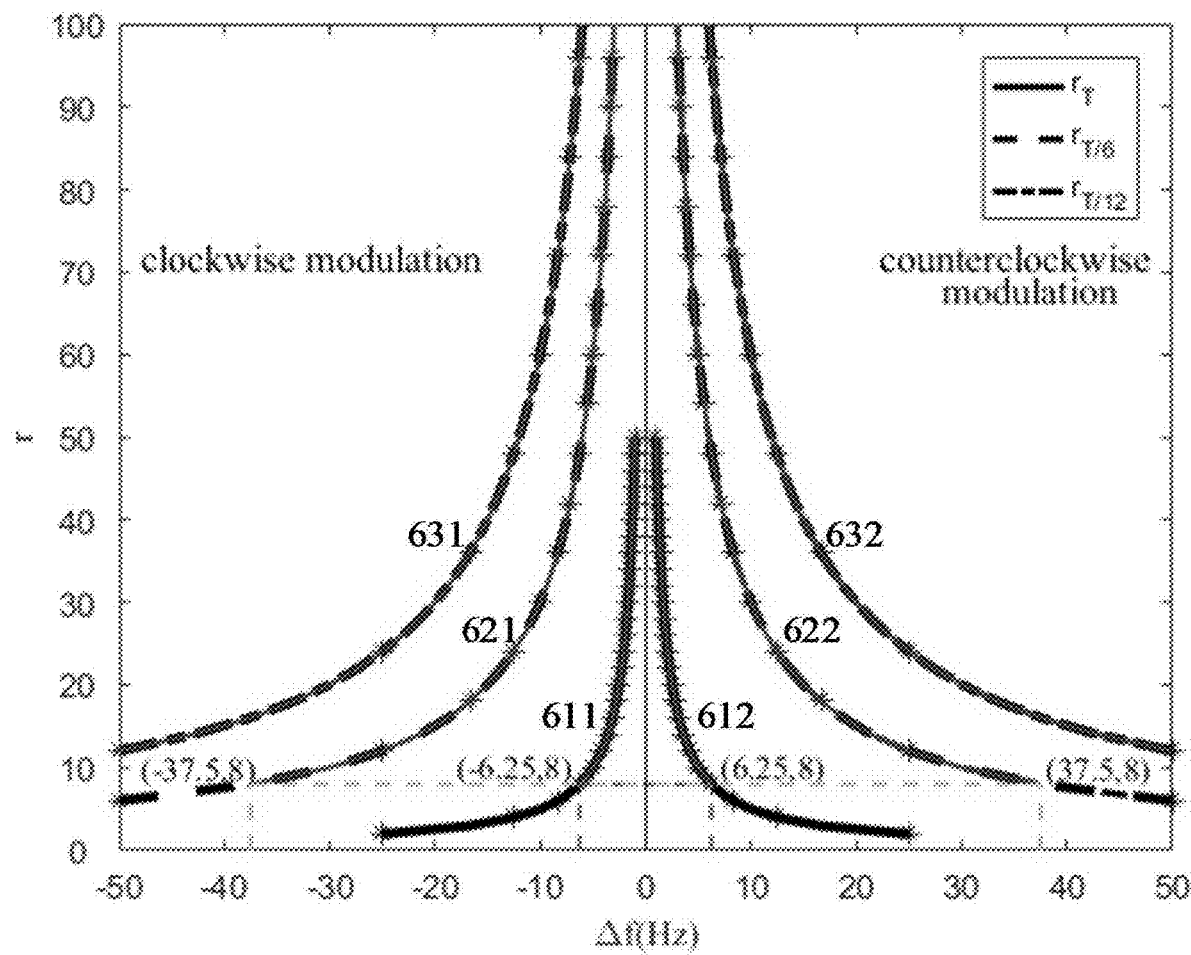
FIG. 6 is a schematic diagram of relationship between frequency offset Δf as the control range between the $h^{th}$ characteristic harmonics and desired inter-harmonics and variable r as the number of fundamental modulated sub-cycles.

It is shown the relationship between frequencies offset |Δf| between the $h^{th}$ characteristic harmonics and desired inter-harmonics, and variable r as the number of fundamental modulated sub-cycles in FIG. 6. When the desired frequency offset is large, one fundamental period as a modulated sub-cycle is not effective; there are these following 3 reasons:

(1) The voltage modulation degree of the inter-harmonic is quite low and the components of the other parasitic inter-harmonics are quite high.

(2) The frequency control range of the desired inter-harmonic is very limited.

(3) Usually the total modulated period cost too much time, it is not good for the control system response requirement.

In order to solve this problem, the T/6 modulation method can be adopted. Further, the T/12 modulation method can be adopted.

Part 611 and 612 of the curves shows the control range by PSR-PWM technique with T as a modulated sub-cycle. i.e. $T=1/f_1$, the maximum frequency offset is $\pm f_1/2$ when $r=2$. Given the case of an output voltage of PWM controlled inverter, the fundamental sub-cycle is usually the fundamental wave period, i.e. T=20 ms. In this case, the fundamental wave and the specific harmonics are controlled at the same time. Their frequency spectrum offsets are the same and the maximum frequency offset is ±25 Hz when r=2.

Further, the total observation cycle $T_{total}$ is equal to $r_T \cdot T$ and the frequency offset $\Delta f$ is equal to $\pm 50/r_T$ Hz. The relationship between the frequency offset $\Delta f$ between a characteristic harmonic and desired inter-harmonics and $r_T$ is presented by line 611 and 612 in FIG. 6. The blue symbol "*" represents the frequency offset when $r_T$ is integer. The solid red line represents the actual valid frequency offset range for this method. By counterclockwise modulation method produces a positive frequency offset relative the frequency of a characteristic harmonic, and clockwise modulation method produces a negative frequency offset relative the frequency of a characteristic harmonic in FIG. 6. The maximum frequency spectrum offset $\Delta f$ is 25 Hz in theory when r is 2, though the THD of parasitic inter-harmonic component is quite high unfortunately.

Further, given $r_T$ is integer, $\Delta f$ may be a non-integer. Also, given $\Delta f$ is integer, $r_T$ may be a non-integer. In this case, the non-integer $r_T$ needs to be transformed to a new integer $r_{T*}$. The transformation is as followings. Transforming $r_T$ as a fraction of m/n (m and n are coprime positive integers), and the new value $r_{T*}$ is m. Meanwhile, $\Delta\theta$ can be expressed as $2\pi \cdot n/m$, and $T_{total}$ is $r_{T*} \cdot T$. The physical meaning of the above transformation of $2\pi \cdot n/m$ is that the phase angle is linearly modulated by n times in m times number of sub-cycles, namely the number of total sub-cycles is m. Then the harmonic and the desired inter-harmonic may be modulated in different whole sub-cycles separately. The proof is similar to that of the principle of signal spectrum relocation, and the result is the same.

When the THD of other inter-harmonics does not exceed 15%, it is considered that the amplitude and phase modulation selective control technique for specific inter-harmonics is effective. The pink line in FIG. 6 indicates the valid control range (THD<15%) of characteristic harmonic spectrum relocation with T as a sub-cycle is from −6.25 Hz to 6.25 Hz.

Line 621 and 622 is the control range of characteristic harmonic spectrum relocation with T/6 as a sub-cycle in similarly. Given the THD component of parasitic inter-harmonics is less than 15%, then the valid frequency offset is from −37.5 Hz to 37.5 Hz in theory. The blue line is the valid control range.

Line 631 and 632 is the control range of characteristic harmonic spectrum relocation with T/12 as a sub-cycle in similarly. The feasible control range of the frequency spectrum offset is −50 Hz to 50 Hz in theory.

The overview of relationship between frequencies control range and the number of sub-cycles for two types of three different methods with modulated sub-cycles T, T/6, T/12 is shown in TAB.1 in FIG. 22 separately.

Figure 7:
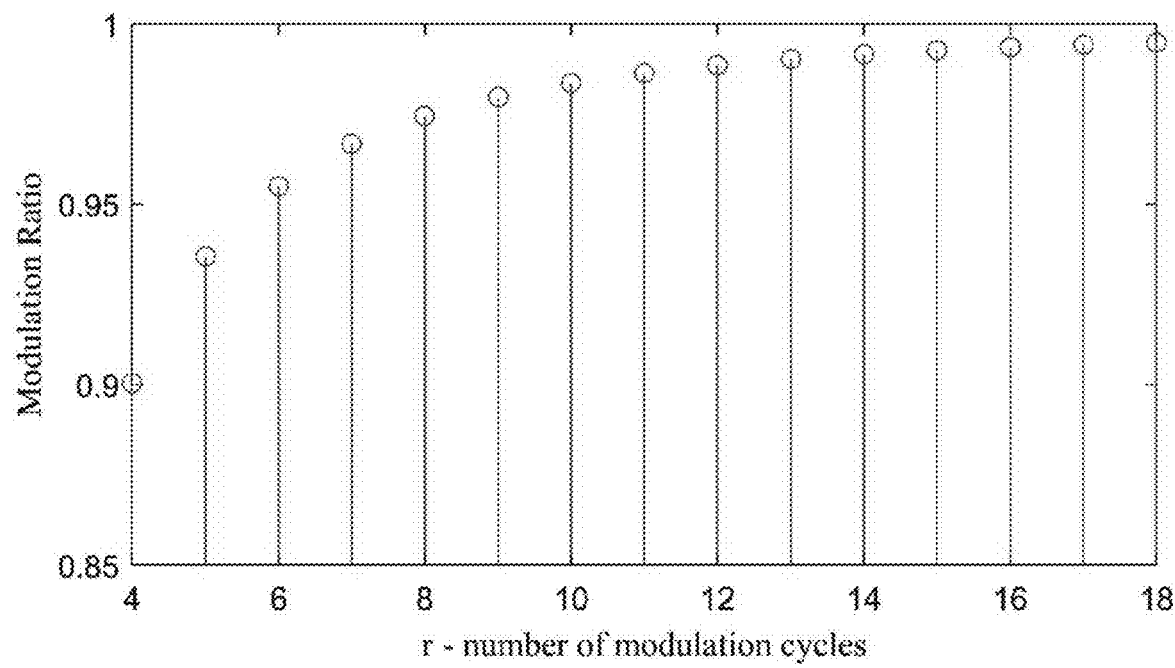
FIG. 7 is a schematic diagram of relationship between signal amplitude modulation ratio $\lambda_T$ and $r_T$ as the number of fundamental modulated sub-cycles.

It is shown the relationship between a signal amplitude modulation ratio $\lambda$ and r as the number of fundamental modulated sub-cycles in FIG. 7. The ratio of inter-harmonic voltage to modulated specific characteristic harmonic voltage is the voltage modulation ratio $\lambda$:

$$\lambda = A_{kh}/A_h \qquad (27)$$

Where $A_h$ is the amplitude of the sinusoidal modulated signal and $A_{kh}$ is the amplitude of the kth frequency component of the modulated inter-harmonic, $A_{kh}=2|F_k|$. The analysis shows that the inter-harmonic frequency component of the counterclockwise modulated signal takes the maximum value at k=r+1, the corresponding frequency is $f_0+f_0/r$, the phase of the corresponding inter-harmonic is $\theta_0-\pi/r$. The amplitude of the corresponding cosine signal of the frequency component $$f_0 + \frac{f_0}{r}$$

is $2|F_{r+1}|$, and the amplitude of the modulated signal is 1, therefore the corresponding voltage modulation ratio $\lambda$ is Sinc($\pi/r$). It can be seen that the larger r is, the closer the modulation ratio is to 1. The amplitude of the other frequency components of parasitic inter-harmonic is quite small.

Figure 8A:
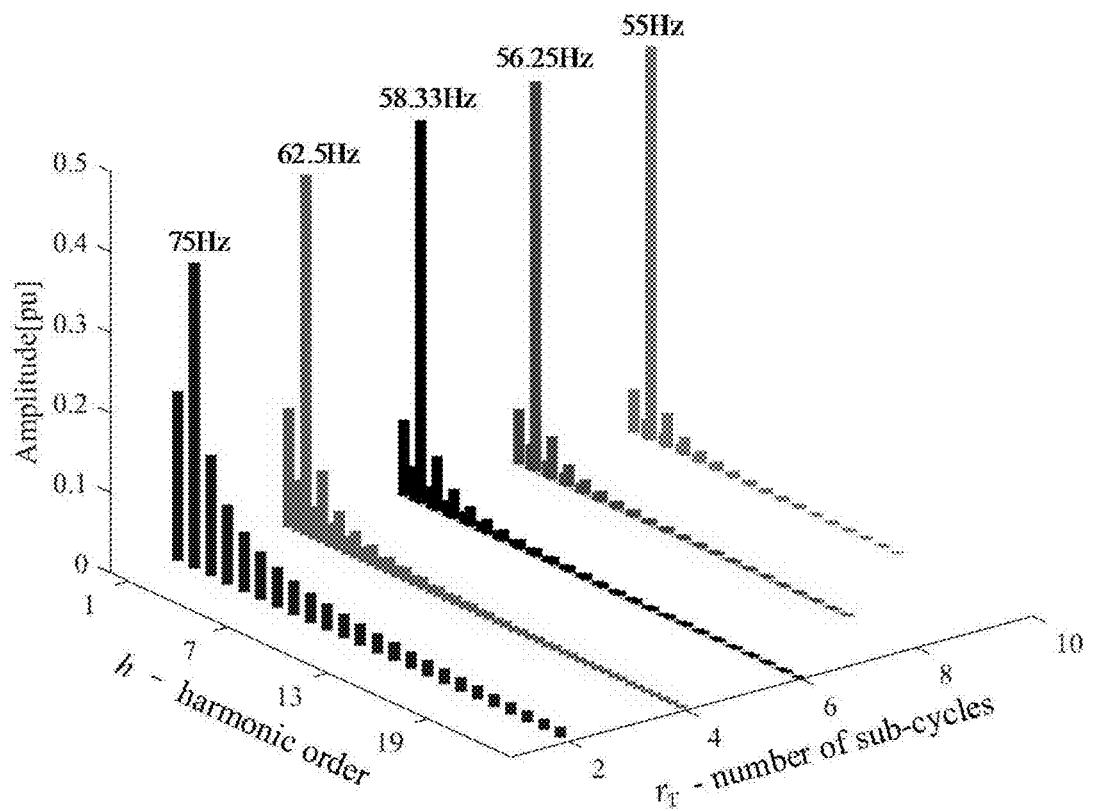
FIG. 8A and FIG. 8B are schematic diagrams of comparison of amplitude performance of different inter-harmonic frequency spectrum shift in sub-harmonics control by T as a modulation sub-cycle in counterclockwise B/clockwise A phase angle modulation.
Figure 8B:
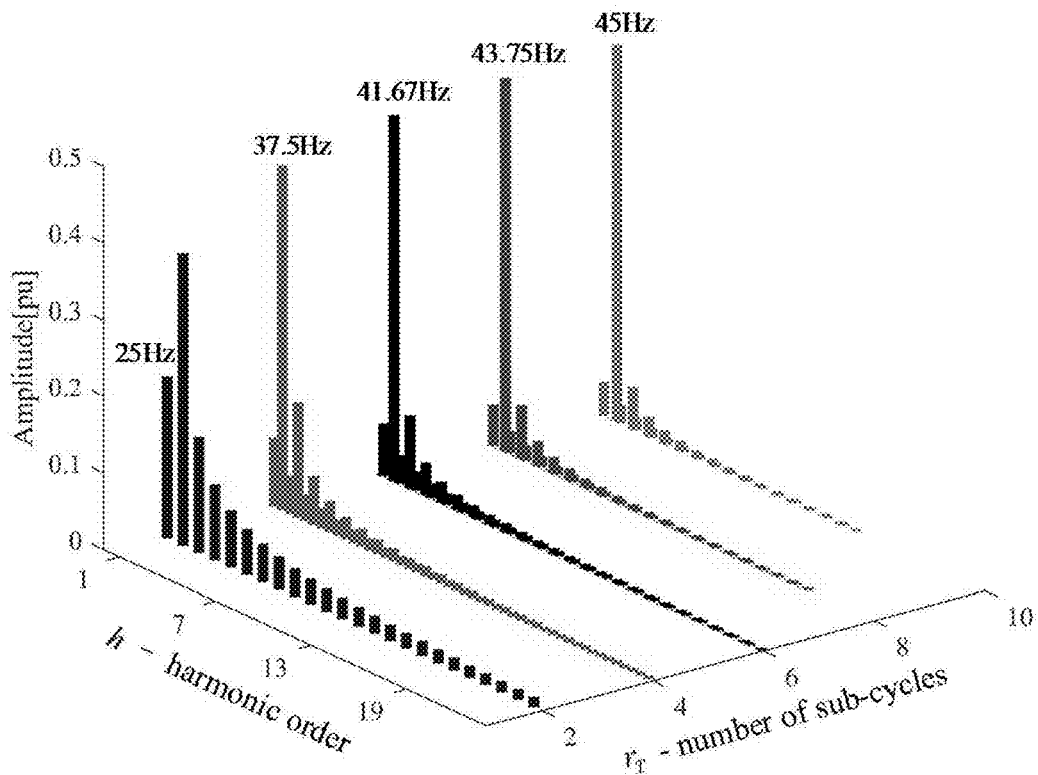

FIG. 8A and FIG. 8B draw a performance comparison diagram of the different frequency offsets of the harmonic spectrum with different r in counterclockwise modulation B and clockwise modulation A. It can be seen that the larger the r is, the closer the amplitude of the largest frequency component is to 0.5, that is, the closer the modulation ratio $\lambda$ is to 1, and the lower the amplitude of other frequency components is, that is, the higher the efficiency of modulation is.

Through counterclockwise modulation, the frequency component with the frequency of $f_0+f_0/r$ can be expressed as:

$$f_{ih}(t)=\text{Sinc}(\pi/r)\cos[2\pi(f_0+f_0/r)t+\theta_0-\pi/r] \qquad (28)$$

We can analyze the clockwise modulation signal by replacing $\omega_0$ with $-\omega_0$. The analysis shows that the inter-harmonic frequency component of the counterclockwise modulated signal takes the maximum value at k=r−1, the corresponding frequency is $f_0-f_0/r$, the initial phase angle of the corresponding inter-harmonic is $\pi/r-\theta_0$, and the corresponding voltage modulation ratio $\lambda$ is Sinc($\pi/r$). The amplitude of the other frequency components is quite small. The frequency component with the frequency of $f_0-f_0/r$ can be expressed as:

$$f_{ih}(t)=\text{Sinc}(\pi/r)\cos[2\pi(f_0-f_0/r)t-\theta_0+\pi/r] \qquad (29)$$

In the above analysis, and the cycle of f(t) is used as the modulated fundamental sub-cycles waveform, each fundamental sub-cycle contains only one cycle of the sinusoidal waveform of f(t), and the frequency of f(t) is shifted.

In the following, another case is discussed, in which the fundamental signal and the $h^{th}$ harmonic of f(t) (the frequency is $hf_0$) are modulated simultaneously, where one cycle of f(t) is still used as the fundamental period, except that each fundamental period contains h cycles of the sinusoidal waveform of the $h^{th}$ harmonic, and the frequency of the $h^{th}$ harmonic is shifted.

The frequency shifting effect of this modulation will be briefly analyzed below, considering only counterclockwise phase angle modulation B and initial phase angle $\theta_0=0$. The proof of clockwise phase angle modulation A is similar to that of the counterclockwise modulation B.

The counterclockwise modulated wave of the ith($1 \le i \le r$) cycle is:

$$f'_{ccw}(t, i) = \cos\left[2\pi h f_0 t + (i-1)\frac{2\pi}{r}\right] \qquad (30)$$

The total counterclockwise modulation signal can be expressed as:

$$f'_{ccw}(t) = \sum_{i=1}^{r} f'_{ccw}(t, i) S_i(t) \quad (0 \le t < rT) \qquad (31)$$

Let the Fourier series of $f'_{ccw}(t,i)$ be $F'_{k,i}$, so the Fourier series of $f'_{ccw}(t)$ is $F'_k = F'_{k,i} \otimes C_{k,i}$. $F'_{k,i}$ is not equal to zero only at $k=\pm hr$, therefore $F'_{k,i} \otimes C_{k,i}$ should include two items:

$$F'_{k,i} \otimes C_{k,i} = \sum_{m=-\infty}^{+\infty} F'_{m,i} C_{k-m,i} = F'_{-hr,i} C_{k+hr,i} + F'_{hr,i} C_{k-hr,i} \qquad (32)$$

The calculation results of these two items are:

$$F'_{-hr,i} C_{k+hr,i} = \frac{1}{2} e^{-j(i-1)\frac{2\pi}{r}} \frac{1}{r} \text{Sinc}\left[\frac{(k+hr)\pi}{r}\right] e^{-j\frac{(k+hr)(2i-1)\pi}{r}} \qquad (33)$$
$$= \frac{1}{2r} \text{Sinc}\left[\frac{(k+hr)\pi}{r}\right] e^{-j\frac{\pi}{r}[2(k+1)i-(k+hr+2)]}$$

$$F'_{hr,i} C_{k-hr,i} = \frac{1}{2} e^{-j(i-1)\frac{2\pi}{r}} \cdot \frac{1}{r} \text{Sinc}\left[\frac{(k-hr)\pi}{r}\right] e^{-j\frac{(k-hr)(2i-1)\pi}{r}} \qquad (34)$$
$$= \frac{1}{2r} \text{Sinc}\left[\frac{(k-hr)\pi}{r}\right] e^{-j\frac{\pi}{r}[2(k-1)i-(k-hr-2)]}$$

Only when $k=ar+1$, the phases angle of $F'_{hr,i} C_{k-hr,i}$ are equal, otherwise they are canceled out; only when $k=ar-1$, the phases angle of $F'_{-hr,i} C_{k+hr,i}$ are equal, otherwise they are canceled out. Therefore, the frequency component of $F'_k$ is not 0 only at $k=ar\pm 1$.

After further analysis, the amplitude characteristic of $F'_k$ is:

$$|F'_k| = \begin{cases} 0.5\text{Sinc}[(1-1/r)\pi] & k=1 \\ 0.5|\text{Sinc}[(a-1+1/r)\pi]| & k=ar+1 \quad (a \ge 1) \\ 0.5|\text{Sinc}[(a+1-1/r)\pi]| & k=ar-1 \quad (a \ge 1) \end{cases} \qquad (35)$$

The phase angle characteristic of $F'_k$ is:

$$\angle F'_k = \begin{cases} (1-1/r)\pi + \theta_0 & k=1 \\ (-1/r)\pi + \theta_0 & k=ar+1 \quad (a \ge 1) \\ -(1-1/r)\pi - \theta_0 & k=ar-1 \quad (a \ge 1) \end{cases} \qquad (36)$$

If the number of sub-cycles r is as large as possible, the inter-harmonic frequency component of the counterclockwise modulated signal takes a maximum value at $k=hr+1$, the corresponding frequency is $hf_0+f_0/r$ and its amplitude is $$\frac{1}{2}\text{Sinc}\left[\frac{\pi}{r}\right].$$

For example, in 10-cycle counterclockwise modulation for the $7^{th}$ harmonic signal (350 Hz), the maximum magnitude of the generated inter-harmonic signal is at a frequency of $$350 + \frac{350}{10 \times 7} = 355 \text{ (Hz)}.$$

The following is a brief analysis of the case where the number of sub-cycles r is not an integer. Let $$r = \frac{m}{n}$$

and m, n be integers, considering only counterclockwise phase angle modulation B and its initial phase angle $\theta_0=0$. The proof of clockwise phase modulation A is similar to that of the counterclockwise modulation B.

The counterclockwise B modulated wave of the ith($1 \le i \le r$) cycle is:

$$f''_{ccw}(t, i) = \cos\left[h\omega_0 t + (i-1)\frac{n \cdot 2\pi}{m}\right] \qquad (37)$$

The total counterclockwise modulation signal can be expressed as:

$$f''_{ccw}(t) = \sum_{i=1}^{m} f''_{ccw}(t, i) S_i(t) \quad (0 \le t < rT) \qquad (38)$$

Let the Fourier series of $f''_{ccw}(t,i)$ be $F''_{k,i}$, so the Fourier series of $f''_{ccw}(t)$ is $F''_k = F''_{k,i} \otimes C_{k,i}$. $F''_{k,i}$ is not equal to zero only at $k=\pm hm$, therefore $F''_{k,i} \otimes C_{k,i}$ should include two items:

$$F''_{k,i} \otimes C_{k,i} = \sum_{a=-\infty}^{+\infty} F''_{a,i} C_{k-a,i} = F''_{-hm,i} C_{k+hm,i} + F''_{hm,i} C_{k-hm,i} \qquad (39)$$

The calculation results of these two items are:

$$F''_{-hm,i}C_{k+hm,i} = \frac{1}{2}e^{-j(i-1)\frac{n2\pi}{m}}\frac{1}{m}\text{Sinc}\left[\frac{(k+hm)\pi}{m}\right]e^{-j\frac{(k+hm)(2i-1)\pi}{m}} \quad (40)$$

$$= \frac{1}{2m}\text{Sinc}\left[\frac{(k+hm)\pi}{m}\right]e^{-j\frac{\pi}{m}[2(k+b)i-(k+hm+2n)]}$$

$$F''_{hm,i}C_{k-hm,i} = \frac{1}{2}e^{-j(i-1)\frac{n2\pi}{m}}\cdot\frac{1}{m}\text{Sinc}\left[\frac{(k-hm)\pi}{m}\right]e^{-j\frac{(k-hm)(2i-1)\pi}{m}} \quad (41)$$

$$= \frac{1}{2m}\text{Sinc}\left[\frac{(k-hm)\pi}{m}\right]e^{-j\frac{\pi}{a}[2(k-n)i-(k-hm-2n)]}$$

Only when k=am+n, the phase angle of $F''_{hm,i}C_{k-hm,i}$ are equal, otherwise they are canceled out; only when k=am−n, the phase angle of $F''_{-hm,i}C_{k+hm,i}$ are equal, otherwise they are canceled out. Therefore, the frequency component of $F_k$ is not 0 only at k=am±n.

After further analysis, the amplitude characteristic of $F''_k$ is:

$$|F''_k| = \begin{cases} \frac{1}{2m}|\text{Sinc}[(a-h+n/m)\pi]| & k = am+n \\ \frac{1}{2m}|\text{Sinc}[(a+h-n/m)\pi]| & k = am-n \end{cases} \quad (42)$$

The phase characteristic of $F''_k$ is:

$$\angle F''_k = \begin{cases} -\frac{m}{n}\pi & k = am+n \quad (a \geq h) \\ -\left(1-\frac{m}{n}\right)\pi & k = am-n \quad (a \geq -h+1) \end{cases} \quad (43)$$

If m is much larger than n, when k=hm+n, the corresponding frequency is $$hf_0 + \frac{n}{m}f_0,$$

and its amplitude is the largest, $$\frac{1}{2}\text{Sinc}\left[\frac{n\pi}{m}\right].$$

For example, in fractional period counterclockwise modulation for 50 Hz signal (h=1, $f_0$=50, m=50, n=3), the maximum magnitude of the generated inter-harmonic signal is at a frequency of $$50 + \frac{3}{50} \times 50 = 53(\text{Hz}).$$

In technique, given a frequency offset Δf is 4 Hz, then $r_T$ is 12.5, which can be written as 25/2, then the new value $r_{T*}$ is equal to 25 and Δθ is 2π/(25/2)=4π/25.

The principle of the T/6 modulation method is demonstrated below, and its frequency characteristics are briefly analyzed. The fundamental sub-cycle of this modulation is T/6, the phase angle of each sub-cycle is linearly increased in $r_{T/6}$ fundamental sub-cycles as T/6, then the number of fundamental sub-cycles is extended to the least common multiple of $r_{T/6}$ and 6 (the following analysis is all based on $6r_{T/6}$ fundamental sub-cycles), so the period of the modulated signal is $r_{T/6}$·T. (For ease of writing, r is used to represent $r_{T/6}$ in the following analysis.)

Define a new window function (i from 1 to 6r):

$$S'_i(t) = \begin{cases} 1 & (i-1)\frac{T}{6} \leq t \leq i\frac{T}{6} \\ 0 & \text{otherwise} \end{cases} \quad (44)$$

The counterclockwise modulated ($\theta_0$=0) wave of the ith(1≤i≤6r) cycle is:

$$f'''_{ccw}(t, i) = \cos\left[h\omega_0 t + (i-1)\frac{2\pi}{r}\right] \quad (45)$$

The total counterclockwise modulation signal can be expressed as:

$$f'''_{ccw}(t) = \sum_{i=1}^{r_{T/6}} f'''_{ccw}(t, i)S'_i(t) \quad (46)$$

Let the Fourier series of $f'''_{ccw}$(t,i) and $S'_i$(t) be $F'''_{k,i}$ 和 $C'_{k,i}$ respectively, then:

$$F'''_{k,i} = \begin{cases} \frac{1}{2}e^{j(i-1)\frac{2\pi}{r}} & k = hr \\ \frac{1}{2}e^{-j(i-1)\frac{2\pi}{r}} & k = -hr \end{cases} \quad (47)$$

$C'_{k,i}$ can be calculated by the following equation:

$$C'_{k,i} = \frac{1}{rT}\int_{(i-1)\frac{T}{6}}^{i\frac{T}{6}} e^{-jk\frac{\omega_0}{r}t}dt \quad (48)$$

The result is:

$$C'_{k,i} = \frac{1}{6r}e^{-j\frac{k\pi(2i-1)}{6r}}\text{Sinc}\left(\frac{k\pi}{6r}\right) \quad (49)$$

The product of signals in time domain corresponds to the convolution of signals in frequency domain, so the Fourier series of $f'''_{ccw}$(t) is $F'''_k=F'''_{k,i}\otimes C'_{k,i}$. $F'''_{k,i}$ is not equal to zero only at k=±hr, therefore $F'''_{k,i}\otimes C'_{k,i}$ should include two items:

$$F'''_{k,i}\otimes C'_{k,i} = \sum_{m=-\infty}^{+\infty} F'''_{m,i}C'_{k-m,i} = F'''_{-hr,i}C'_{k+hr,i} + F'''_{hr,i}C'_{k-hr,i} \quad (50)$$

The calculation results of these two items are:

$$F'''_{-hr,i} C'_{k+hr,i} = \frac{1}{2} e^{-j(i-1)\frac{2\pi}{r}} \frac{1}{6r} \text{Sinc}\left[\frac{(k+hr)\pi}{6r}\right] e^{-j\frac{(k+hr)(2i-1)\pi}{6r}} \quad (51)$$

$$= \frac{1}{2 \times 6r} \text{Sinc}\left[\frac{(k+hr)\pi}{6r}\right] e^{-j\frac{\pi}{6r}[2(k+hr+6)i-(k+hr+12)]}$$

$$F'''_{hr,i} C'_{k-hr,i} = \frac{1}{2} e^{j(i-1)\frac{2\pi}{r}} \cdot \frac{1}{6r} \text{Sinc}\left[\frac{(k-hr)\pi}{6r}\right] e^{-j\frac{(k-hr)(2i-1)\pi}{6r}} \quad (52)$$

$$= \frac{1}{2 \times 6r} \text{Sinc}\left[\frac{(k-hr)\pi}{6r}\right] e^{-j\frac{\pi}{6r}[2(k-hr-6)i-(k-hr-12)]}$$

Only when k=a·6r+hr+6, the phases angle of $F'''_{hr,i} C'_{k-hr,i}$ are equal, otherwise they are canceled out; only when k=a·6r-hr-6, the phase angles of $F'''_{-hr,i} C'_{k+hr,i}$ are equal, otherwise they are canceled out. Therefore, the frequency component of $F'''_k$ is not 0 only at k=ar±(hr+6).

After further analysis, the amplitude characteristic of $F'''_k$ is:

$$|F_k| = \begin{cases} \frac{1}{2 \times 6r} \text{Sinc}\left[\left(a+\frac{1}{r}\right)\pi\right] & k = a \cdot 6r + hr + 6 \\ \frac{1}{2 \times 6r} \text{Sinc}\left[\left(a-\frac{1}{r}\right)\pi\right] & k = a \cdot 6r - hr - 6 \end{cases} \quad (53)$$

The phase angle characteristic of $F'''_k$ is:

$$\angle F_k = \begin{cases} -\frac{\pi}{r} & k = a \cdot 6r + hr + 6 \quad (a \geq 0) \\ \left(1-\frac{1}{r}\right)\pi & k = a \cdot 6r - hr - 6 \quad (a \geq 0) \end{cases} \quad (54)$$

When k=hr+6, the frequency component of the modulated signal takes a maximum value, $$\frac{1}{2 \times 6} \text{Sinc}\left[\frac{\pi}{r}\right],$$

the corresponding frequency is $$\omega_0\left(h + \frac{6}{r}\right).$$

For example, in counterclockwise modulation for 50 Hz signal ($r_{T/6}$=12), the frequency can be shifted to 50×(1+6/12)= 75 (Hz).

Figure 9A:
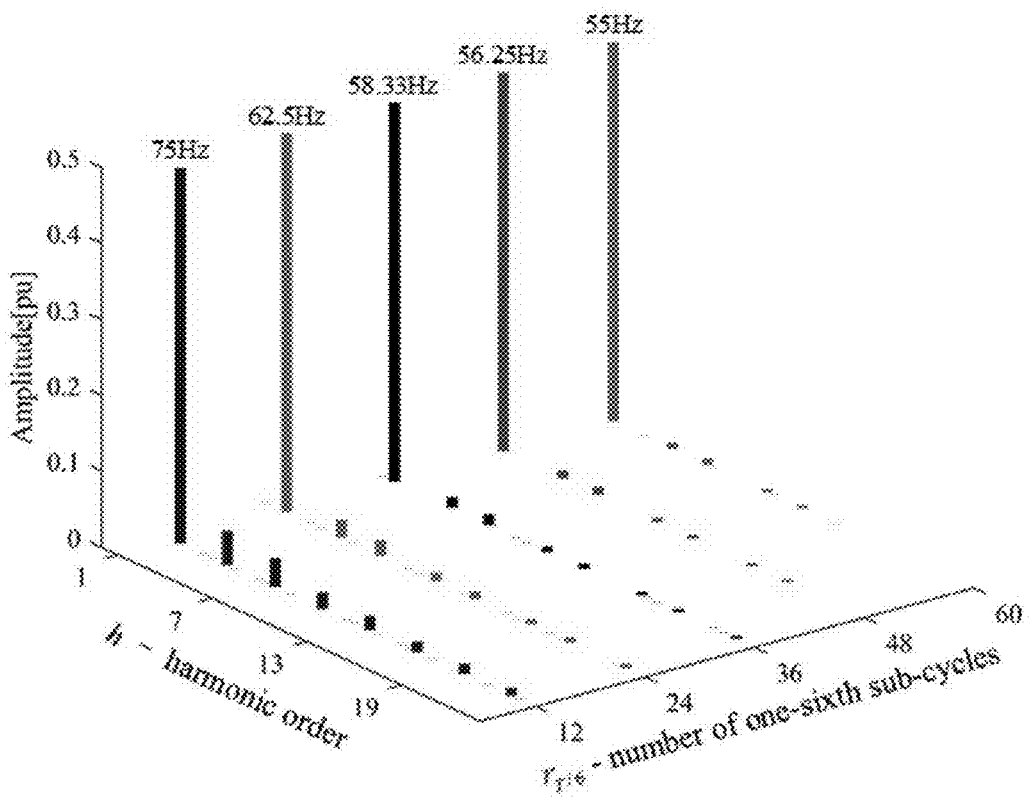
FIG. 9A and FIG. 9B are schematic diagrams of comparison of amplitude performance of different inter-harmonic frequency spectrum shift in sub-harmonics control by PSR with T/6 as a modulation sub-cycle in counterclockwise B/clockwise A phase angle modulation.
Figure 9B:
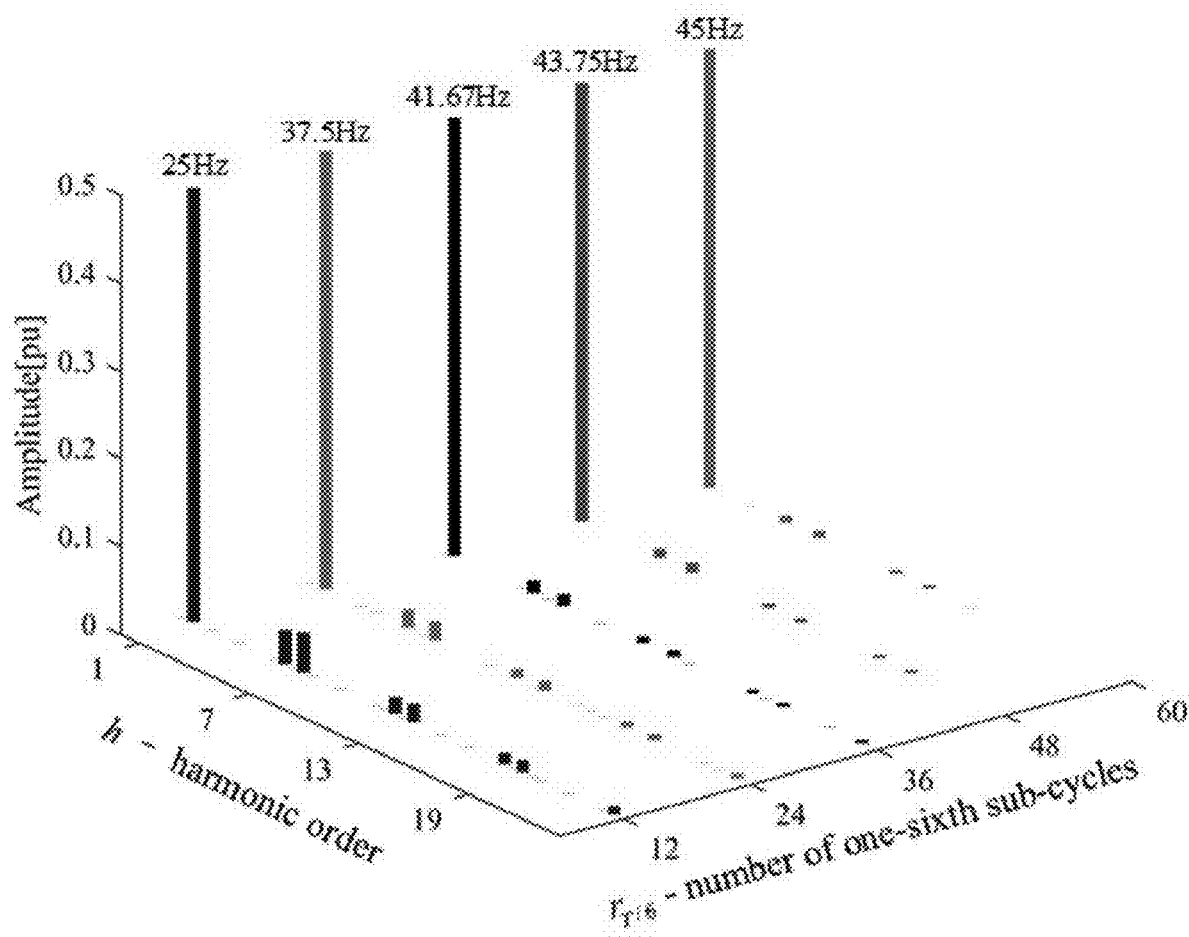

FIG. 9A and FIG. 9B draws a performance comparison of amplitude of different inter-harmonic frequency spectrum shift in sub-harmonics control by T/6 as a modulation sub-cycle in counterclockwise B and according to clockwise A phase angle modulation separately. It is similar to the modulation fundamental sub-cycle with T period as shown in FIG. 8A and FIG. 8B. The larger the $r_{T/6}$ is, the closer the amplitude of the largest frequency component is to 0.5, that is, the closer the modulation ratio λ is to 1, and what's better is the rest of the frequency has a quite lower amplitude, so this modulation method have a better performance, meanwhile, the total modulated period take less time, it may be better for control response requirement.

By using the spectrum relocation principle mentioned above, the frequency, amplitude and phase of the inter-harmonic signal can be controlled. By changing the number of fundamental cycles r, a frequency offset can be generated symmetrically on both sides of the spectrum of the modulated signal, with an offset Δf of ±$f_0$/r, and the larger r is, the closer the modulation ratio to 1.

The output inter-harmonic phase angle is only related to r and $\theta_0$, the initial phase angle of the first fundamental sub-cycle, and is linearly with $\theta_0$. Therefore, by changing the initial phase of the first fundamental period of the modulated signal $\theta_0$, the phase angle of the output inter-harmonic signal $\theta_{ih0}$ can be controlled, thereby achieving control of specific inter-harmonics.

Figure 10:
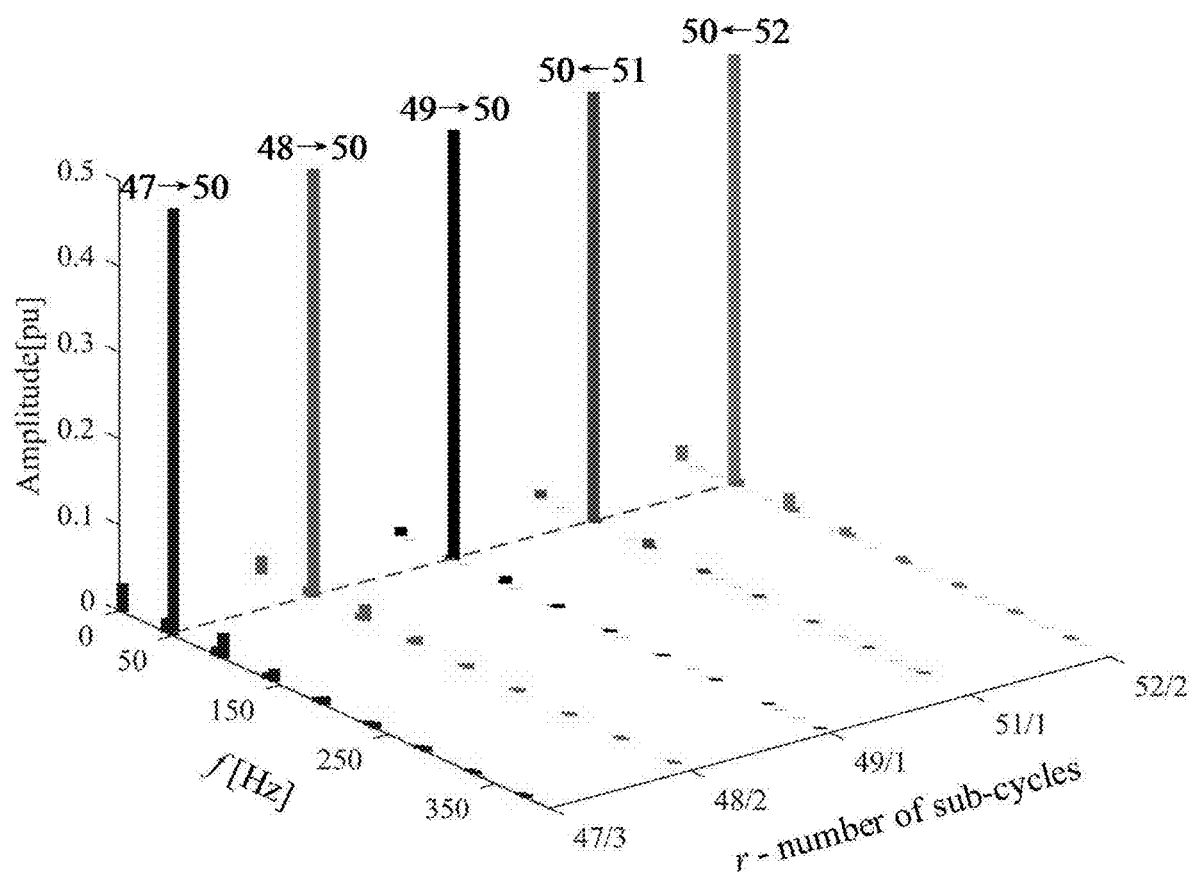
FIG. 10 is a schematic diagram of diagram of FFT amplitude-frequency characteristics for control several different sub-super harmonics shifting to the rated grid frequency 50 Hz.

FIG. 10 shows the diagram of FFT amplitude-frequency characteristics for control several different sub-super harmonics with 47 Hz, 48 Hz, 49 Hz, 51 Hz and 52 Hz shifting to the rated grid frequency 50 Hz separately. That means, the PSR-PWM technique can also enable the inverter to transfer some sub-harmonic voltages to the fundamental frequency voltage when the voltage source inverter is the only source of power, i.e. the voltage source inverter link supplies power to an isolated load. When the voltage source converter is connected to an active power system, namely the frequency deviations of the grid at 47 Hz, 48 Hz, 49 Hz, 51 Hz and 52 Hz separately, the inverter can behave as a synchronous generator with rated voltage 0.5 pu and rated frequency 50 Hz in grid operation by different frequency offsets with 3 Hz, 2 Hz, 1 Hz, -1 Hz, -2 Hz separately.

Figure 11:
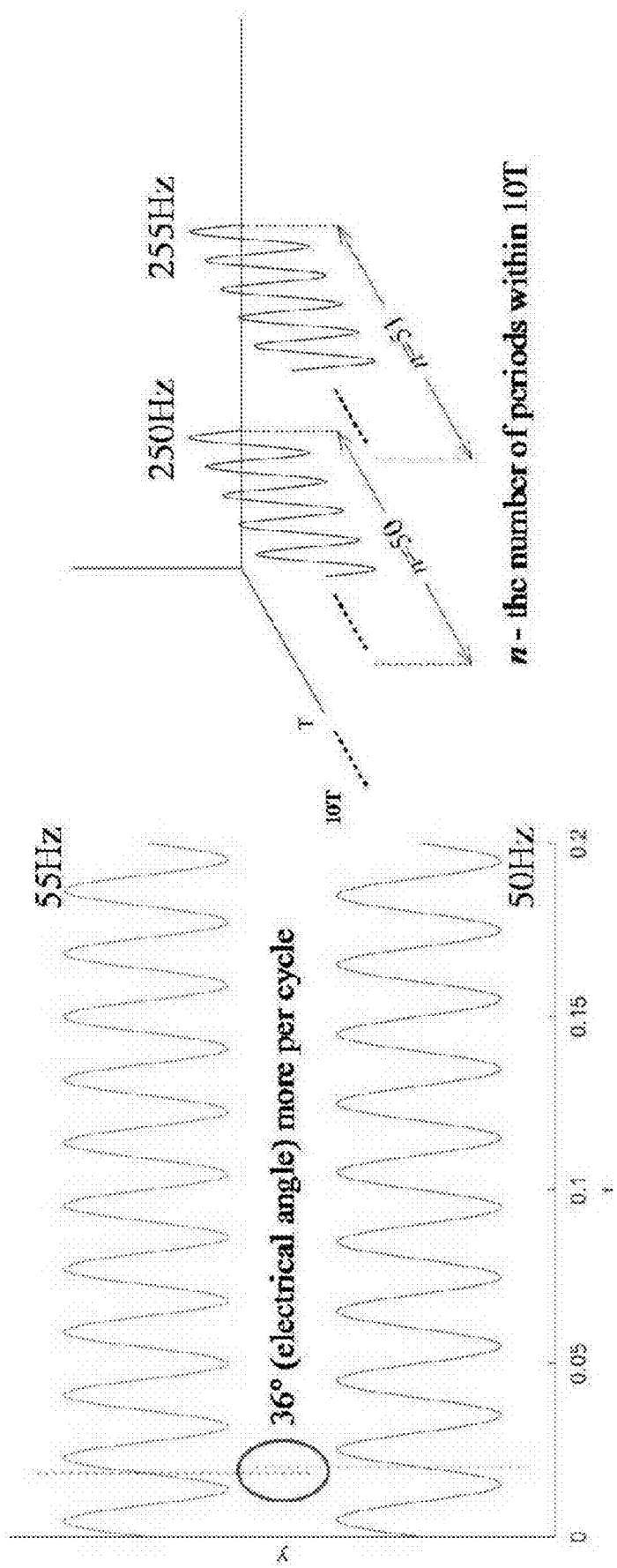
FIG. 11 is a schematic diagram of physical meaning of transforming a signal frequency spectrum to another signal frequency spectrum by a frequency offset.

FIG. 11 shows a schematic diagram of the physical meaning of the signal with a frequency $f_h$ transforming to the desired inter-harmonics with a frequency $f_{ih}$ by a linearly modulated phase angle Δθ to obtain a frequency spectrum offset.

Considering the 5$^{th}$ harmonic to control the 255 Hz inter-harmonic, in time period of 20 ms the fundamental waveform voltage has an electrical angle 360°, namely, the 5$^{th}$ harmonic has an electrical angle of 1800°, the inter-harmonic of 255 Hz has an electrical angle of (255*1800/ 250=1836)°. Within 10 fundamental periods (200 ms), the number of periods is 50 for 250 Hz signals and 51 for 255 Hz signals. Therefore, given the 255 Hz harmonic voltage is to be controlled, the phase angle of the 5$^{th}$ harmonic should be controlled step by step of (1836−1800=36°) during a fundamental time period, and the number of modulation sub-cycles is 360/36=10. Its schematic diagram is shown in the left side in FIG. 11.

The calculation formula of phase increment is given as the following:

$$\Delta\theta = \frac{(f_{ih} - f_h) \cdot 360°}{50} \quad (55)$$

For another two different modulation sub-cycles as T/6 and T/12 separately, their phase angle variables are provided as the followings, too.

$$\Delta\theta_{T/6} = \Delta\theta_T / 6 = \frac{(f_{ih} - f_h) \cdot 360°}{50 \cdot 6} \quad (56)$$

$$\Delta\theta_{T/12} = \Delta\theta_T / 12 = \frac{(f_{ih} - f_h) \cdot 360°}{50 \cdot 12} \quad (57)$$

For example, the modulated phase angle variable $\Delta\theta_{5/T}$ of the 5$^{th}$ harmonic can be controlled step by step of (255− 250)·360°/50=36° during a modulation sub-cycle T.

Similarly, the principle of modulated 50 Hz signals to 55 Hz signals by PSR is the same. Its schematic diagram is demonstrated in the right side in FIG. 11.

Figure 12:
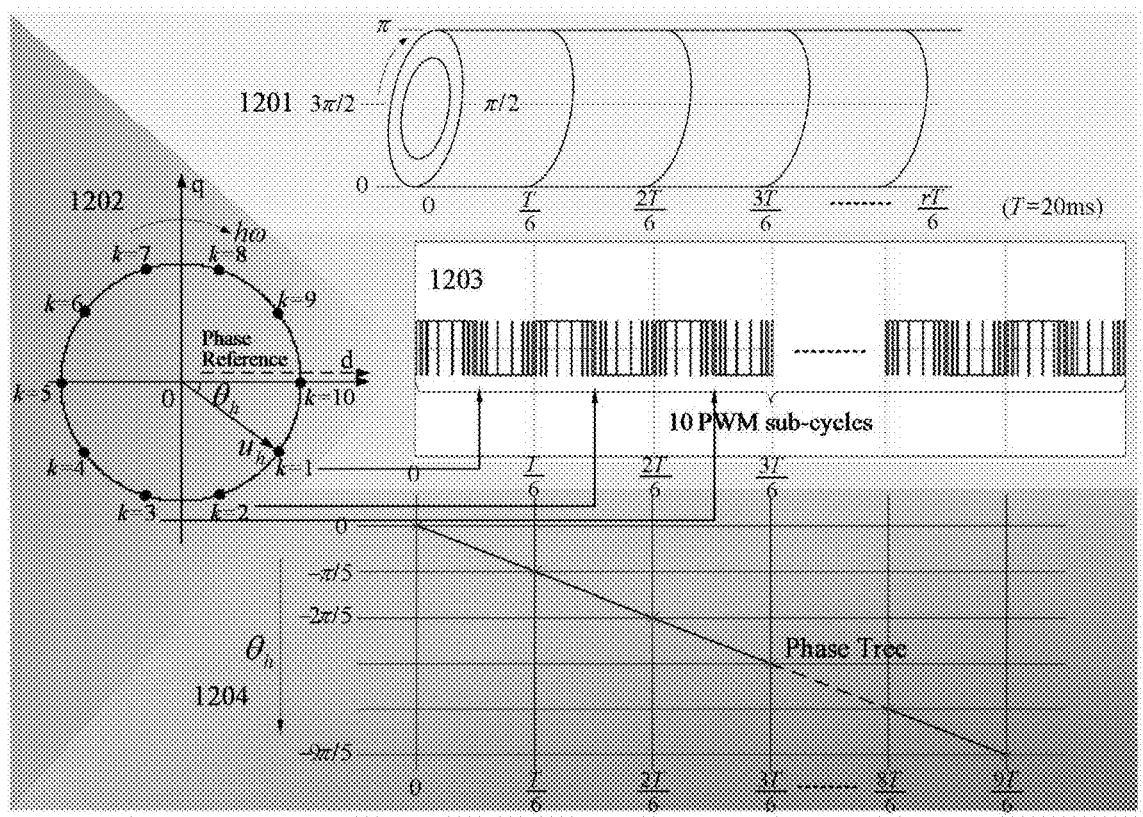
FIG. 12 is a schematic diagram of the linear modulation of phase angles by PSR-PWM technique by an example of $5^{th}$ harmonics in 10 fundamental wave periods.

FIG. 12 draws the schematic diagram of the linear modulation of phase angles by PSR-PWM technique with an example of $5^{th}$ harmonics in 10 fundamental wave periods. It is aimed to shift the spectrum of the inverter output characteristic harmonics with their modulated phase angles in multi sub-cycles T, so that to directly control the frequency, amplitude and phase angle of the inter-harmonics. The initial phase angle of a particular characteristic harmonic in the r fundamental sub-cycles as T is linearly modulated in order to shift particular characteristic harmonics to the desired inter-harmonic spectral position.

In 1202, the voltage vector is used to represent the $h^{th}$ characteristic harmonic in the complex plane, where $u_h$ is its amplitude and $\theta_h$ is its phase angle. Converting the $h^{th}$ harmonic to the dq rotating coordinate system, the sine and cosine components of the $h^{th}$ harmonic in the complex plane respectively correspond to the d-axis and q-axis components, then the magnitude and phase information of the $h^{th}$ harmonic can be identified by the black dot in the dq rotating coordinate system. In 10 fundamental sub-cycles as 10T, the phase angle of the $h^{th}$ harmonic modulation are labeled in the clockwise direction A with the number from 1 through 10, respectively.

1204 is a phase tree, the red symbol "×" is used to mark the initial phase angles of the modulated characteristic harmonics in 10 fundamental sub-cycles, respectively.

In 1203, a PSR-PWM pulse pattern waveform of a specific inter-harmonic is generated according to the amplitudes $A_h$ and phases angle $\theta_h$ of the fundamental wave and a specific characteristic harmonic in 10 fundamental sub-cycles. In each fundamental sub-cycle, the PWM waveform is modulated linearly by its initial phase angle.

The characteristics of the pulse pattern waveform constructed in steady state are as follows:

(1) The amplitude of the modulated $h^{th}$ characteristic harmonic remains unchanged, but its initial phase angle changes linearly from the fundamental sub-cycle (i−1)T to the next fundamental sub-cycle iT according to a certain phase angle increment (clockwise decrement A or counter-clockwise increment B);

(2) One or more different $h^{th}$ characteristic harmonics can be modulated simultaneously as above.

Figure 13:
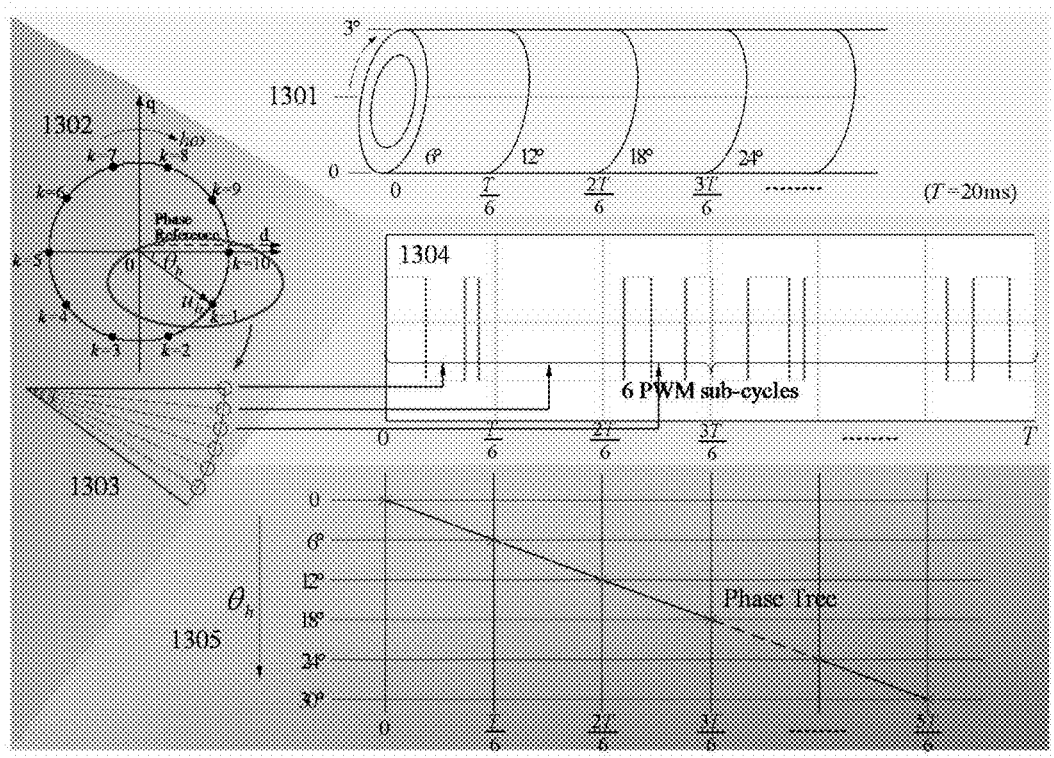
FIG. 13 is a schematic diagram of the linear modulation of phase angles by PSR-PWM technique by an example of the modulated $h^{th}$ harmonics with a sub-cycle as T/6.

FIG. 13 shows the schematic diagram of the linear modulation of phase angles by PSR-PWM technique with an example of the $5^{th}$ harmonics in 1 total fundamental wave period and their linear modulation of phase angles in the modulated sub-cycle as T/6.

The modulated phase angle variable $\Delta\theta_{5,T/6}$ of the $5^{th}$ harmonic can be controlled step by step of (255−250)·360°/(50·6)=6° during a modulation sub-cycle T. Based on the specific inter-harmonics PWM method in FIG. 12, in 1302, within one fundamental time sub-cycle, the phase angle is subdivided into 6 parts (see 1303), that is, the phase angle increment is 6°. In 1304, the PWM wave generated by this method requires that the amplitude and phase angle of the fundamental wave in each T/6 to be constant, and the amplitude of the $5^{th}$ characteristic harmonic to be constant, and the initial phase angle of the $5^{th}$ harmonic at each T/6 is increased by 6° compared to the previous sub-cycle T/6.

Figure 14:
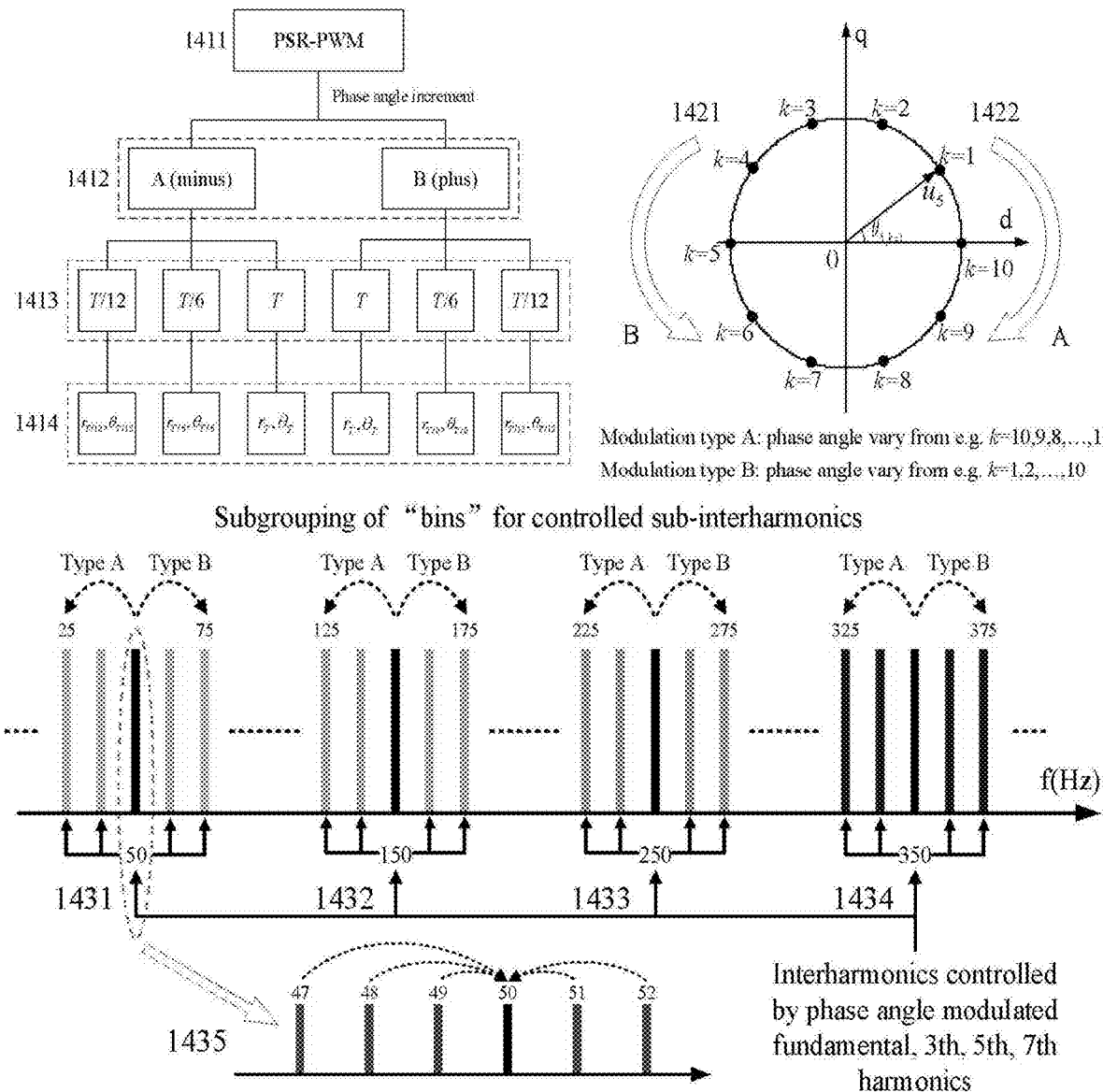
FIG. 14 is a schematic diagram of classification of the PSR-PWM technique and its subgrouping of the inter-harmonic frequency control range for each modulated characteristic harmonic.

In FIG. 14, 1412 divides the PSR-PWM technique into two categories, A (clockwise modulation) and B (counter-clockwise modulation), which are illustrated in 1421 and 1422. In 1413, each category is divided into 3 types according to the sub-cycle length: T, T/6, and T/12. Each method type needs to determine its different r and θ as in 1414 separately.

1431-1434 is the subgrouping of the inter-harmonic frequency control range for each modulated characteristic harmonic by the PSR-PWM technique. We can see, the black color bars indicate the modulated output characteristic harmonics of an inverter, and other colored lines indicate inter-harmonics that can be controlled by this modulation. Theoretically, the frequency control range of inter-harmonic is from 0 to any frequency by this PWM. That is to say, the main ideas in 1431-1434 are about how to extend the frequency control range of inter-harmonics by PSR-PWM technique, e.g. 1431: using the fundamental component to control the sub-harmonics between 0 Hz to 100 Hz; 1432: using the 3rd harmonic to control the inter-harmonics between 100 Hz to 200 Hz; 1433: using the $5^{th}$ harmonic to control the inter-harmonics between 200 Hz to 300 Hz; 1434: using the $7^{th}$ harmonic to control the inter-harmonics between 300 Hz to 400 Hz; and so on. In theory the frequency of inter-harmonic control range is from 0 to ∞Hz. 1435 is another frequency control by the PSR-PWM technique different from the example in 1431-1434, it transfers the sub-harmonics near 50 Hz to the fundamental frequency voltage.

Figure 15:
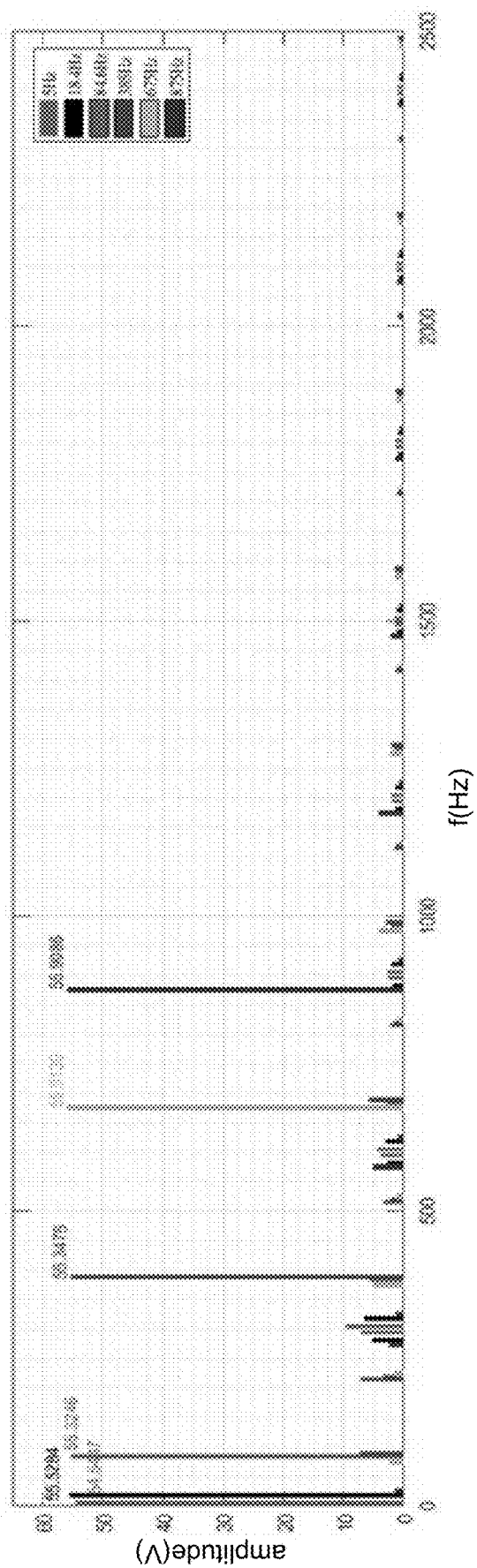
FIG. 15 is a schematic diagram of FFT analysis of inter-harmonics controlled by PSR-SVPWM with T/6 as a modulated sub-cycle.
Figure 16:
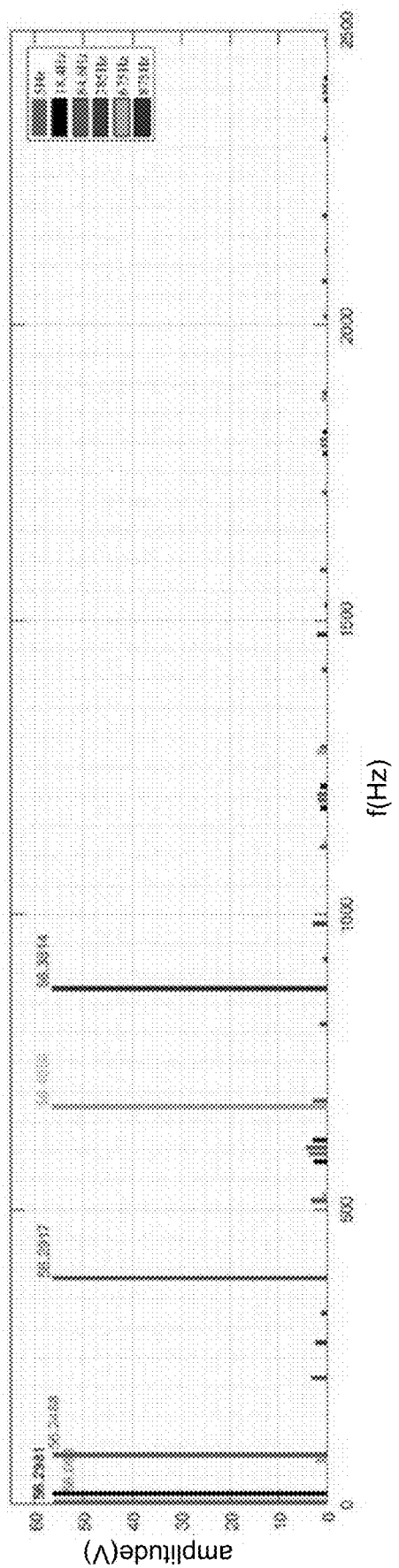
FIG. 16 is a schematic diagram of analysis of FFT for inter-harmonics generated by PSR-SVPWM with T/12 as a modulation sub-cycle.

To illustrate the ubiquity of the method, this disclosure also provides the following simulation cases: the 50 Hz fundamental voltage and specific harmonics voltage are transformed to the frequency spectrum as 5 Hz, 18.4 Hz, 84.6 Hz, 385 Hz, 675 Hz, 875 Hz inter-harmonics by PSR-SVPWM respectively, with T/6 and T/12 as a modulation sub-cycle separately. FIG. 15 shows the FFT analysis of the specific inter-harmonics with 5 Hz, 18.4 Hz and 84.6 Hz shifted from 50 Hz by PSR-SVPWM with T/6 as a sub-cycle and 385 Hz shifted from 350 Hz, 675 Hz shifted from 650 Hz, 875 Hz shifted from 850 Hz by PSR-SVPWM with T/6 as a sub-cycle. FIG. 16 shows the FFT analysis of the specific inter-harmonics with 5 Hz, 18.4 Hz, 84.6 Hz shifted from 50 Hz by PSR-SVPWM with T/6 as a sub-cycle and 385 Hz shifted from 350 Hz, 675 Hz shifted from 650 Hz, 875 Hz shifted from 850 Hz by PSR-SVPWM with T/12 as a sub-cycle. The overview of basic characteristic of PSR-PWM based typical simulation cases are shown in TAB.2 in FIG. 23.

The frequency offset between modulate frequency 50 Hz and desired frequency spectrum as 5 Hz is 45 Hz, according to the above calculation theory, the number of modulated T/6 sub-cycles $r_{T/6}$=50/(50−5)·6=60/9; supposed the initial phase angle of fundamental voltage as 0; the theoretical phase angle is π/r=27°. The switching frequency is 4 kHz for a Space Vector Pulse Width Modulation (SVPWM), and supposed the DC voltage $U_{dc}$=100V. It is shown that some components of these parasitic inter-harmonics with their amplitudes at (300a±5)Hz (a is an integer) are not zero separately It can be seen that the maximum amplitude at 5 Hz is 54.5447V, its phase angle is 27.0149°, and the phase angle error between its theory value and simulation value is 27.0149°−27°=0.0149°. The component of parasitic inter-harmonics are quite small at some frequency spectrum with (300±5)Hz, (600±5)Hz, . . . (300a±5)Hz and so on, and the parasitic inter-harmonic amplitude becomes smaller as inter-harmonic order variable a increases, where a is an integer. And the DC voltage utilization $M_{5\ Hz}$=0.8568 for the fundamental to the desired 5 Hz inter-harmonic output voltage, in comparison with the traditional modulation for fundamental signal is 0.866, the modulation ratio λ=0.8568/0.866=0.9894.

Shift 50 Hz fundamental to 5 Hz inter-harmonic by PSR-SVPWM with T/12 modulation sub-cycle. The 50 Hz fundamental voltage is transformed to the frequency spectrum as 5 Hz inter-harmonic by PSR-SVPWM with T/12 as a modulation sub-cycle. The frequency offset between modulate frequency 50 Hz and desired frequency spectrum as 5 Hz is 45 Hz, according to the above calculation theory, the number of modulated T/12 sub-cycles $r_{T/12}$=50/(50−5)·12=120/9; given the initial phase angle of fundamental voltage as 0; the theoretical phase angle is π/r=13.5°. The switching frequency is 4 kHz for a Space Vector Pulse Width Modulation (SVPWM), and supposed the DC voltage $U_{dc}$=100V. It is shown that some components of these parasitic inter-harmonics with their amplitudes at (600a±5) Hz (a∈Z) are not zero separately It can be seen that the maximum amplitude at 5 Hz is 56.091V, its phase angle is 13.51540, and the phase angle error between its theory value and simulation value is 13.5154°−13.5°=0.015°. The component of parasitic inter-harmonics are quite small at some frequency spectrum with (600±5)Hz, (1200±5)Hz, . . . (600a±5)Hz (a∈Z) and so on, and the parasitic inter-harmonic amplitude becomes smaller as inter-harmonic order variable a increases, where a is an integer. And the DC voltage utilization $M_{5\ Hz}$=0.8811 for the fundamental to the desired 5 Hz inter-harmonic output voltage, in comparison with the traditional modulation for fundamental signal is 0.866, the modulation ratio λ=0.8811/0.866=1.017. The above simulation results are consistent with the theoretical values.

In order to prove the feasibility of the control of a specific inter-harmonic, the distorted power grid for a weak grid is simulated by an ideal three-phase inter-harmonic voltage source, and the load is composed of resistance and inductance in series. The inter-harmonic compensator is designed to connect to the grid through a serial transformer.

Figure 17:
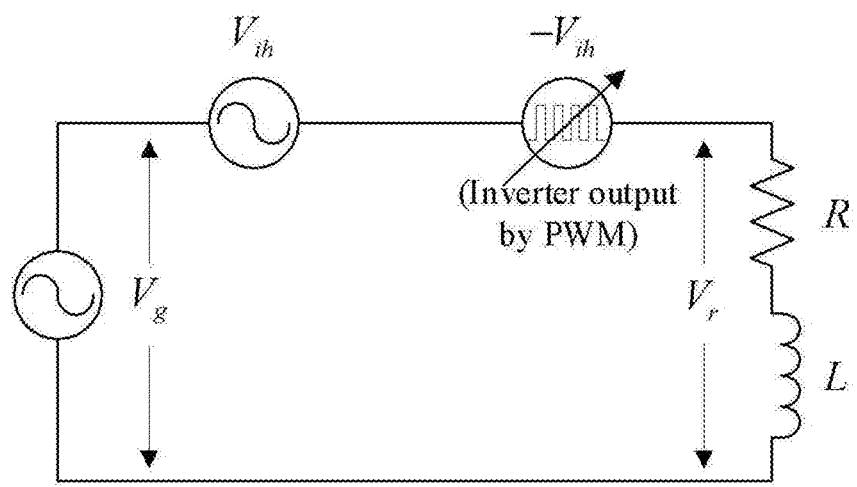
FIG. 17 is a schematic diagram of three-phase AC power grid superimposing inter-harmonic voltage source by a series inter-harmonic voltage compensator.

FIG. 17 depicts the experimental schematic diagram of three-phase AC power grid superimposing inter-harmonic voltage source with a series inter-harmonic voltage compensator for a specific inter-harmonic control. Vg is the three-phase voltage of the grid, $V_{ih}$ is the three phase inter-harmonic voltage source for grid accompanied with distorted voltage source, $-V_{ih}$ is the inter-harmonic voltage output by the three-phase inverter, and $V_r$ is the voltage of the three-phase load including resistance R and inductance L.

Figure 18:
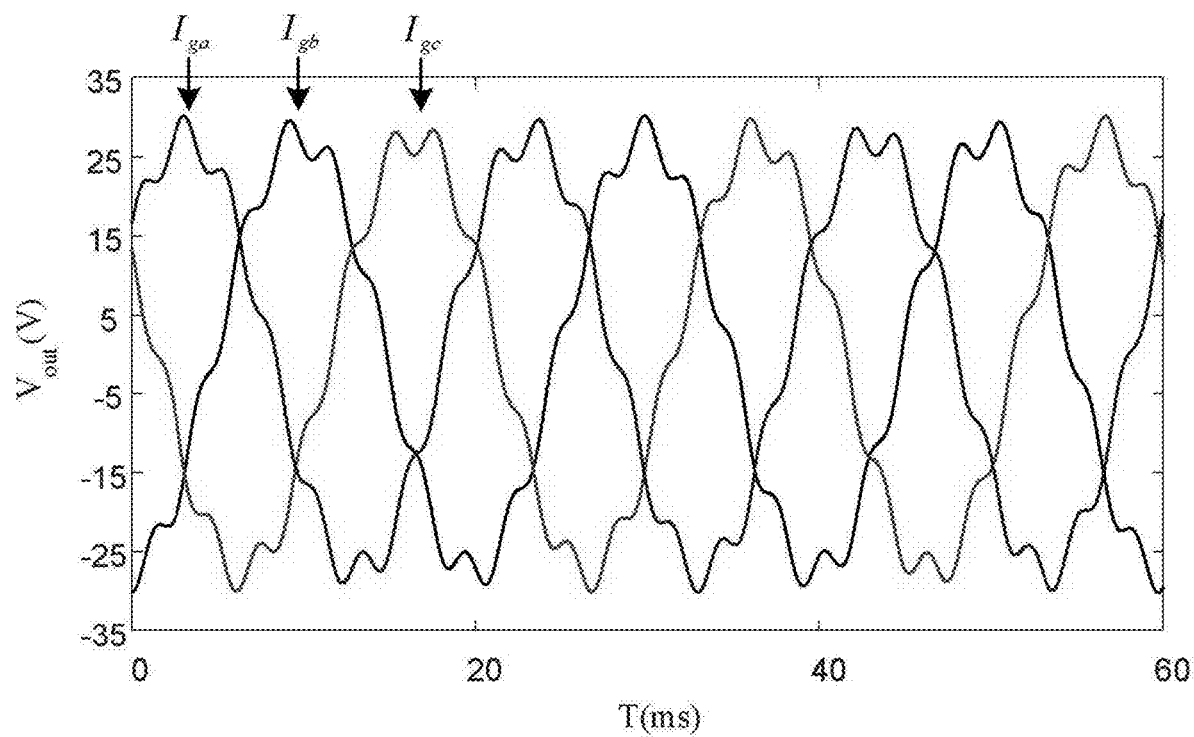
FIG. 18 is a schematic diagram of the three-phase current waveform of the grid superimposed with an inter-harmonic voltage source.
Figure 19:
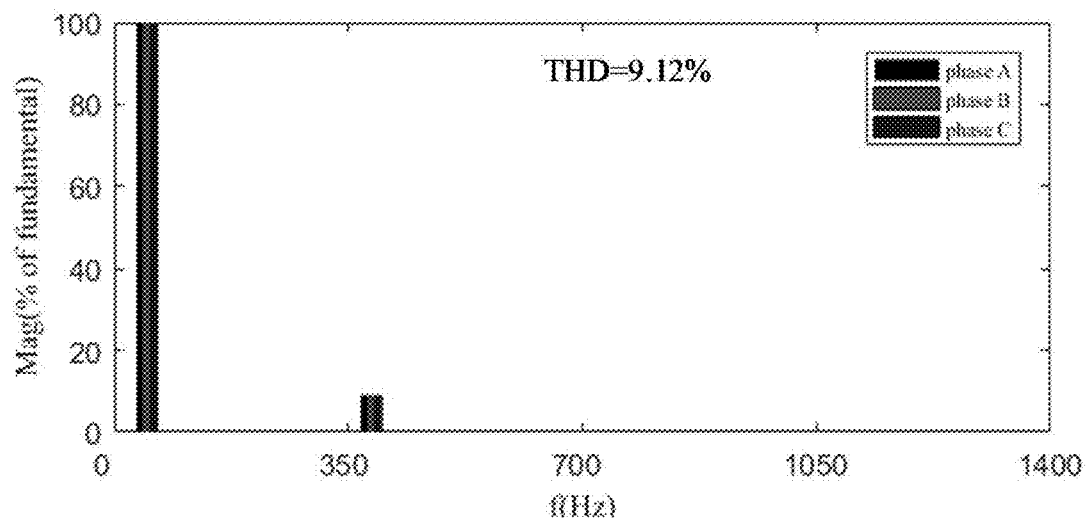
FIG. 19 is a schematic diagram of FFT analysis of the three-phase current waveform of the grid superimposed with an inter-harmonic voltage source.

FIG. 18 shows the measured three-phase phase current waveform of the grid, and FIG. 19 shows its FFT analysis. The voltage amplitude of the inter-harmonic source is given to 10% of the grid voltage. When the inverter device is not connected to the grid. The fundamental current is 27.52 A, and the inter-harmonic current is 2.75 A. It can be seen that the grid current waveform is seriously distorted after the superimposed inter-harmonic voltage of 385 Hz. In addition to the fundamental current, the three-phase phase current of the grid is superimposed with the inter-harmonic current of 385 Hz.

By controlling the three-phase output voltage of the inverter to compensate the distorted grid voltage with the specific inter-harmonic voltage into the grid, the distorted inter-harmonic source $V_{ih}$ in the grid is compensated. The amplitude of the output voltage of the inverter is equal to that of the inter-harmonic voltage of the grid, and their phase is opposite. This experiment means to demonstrate the control a specific inter-harmonic according to its amplitude and phase angle by an inverter directly.

Figure 20:
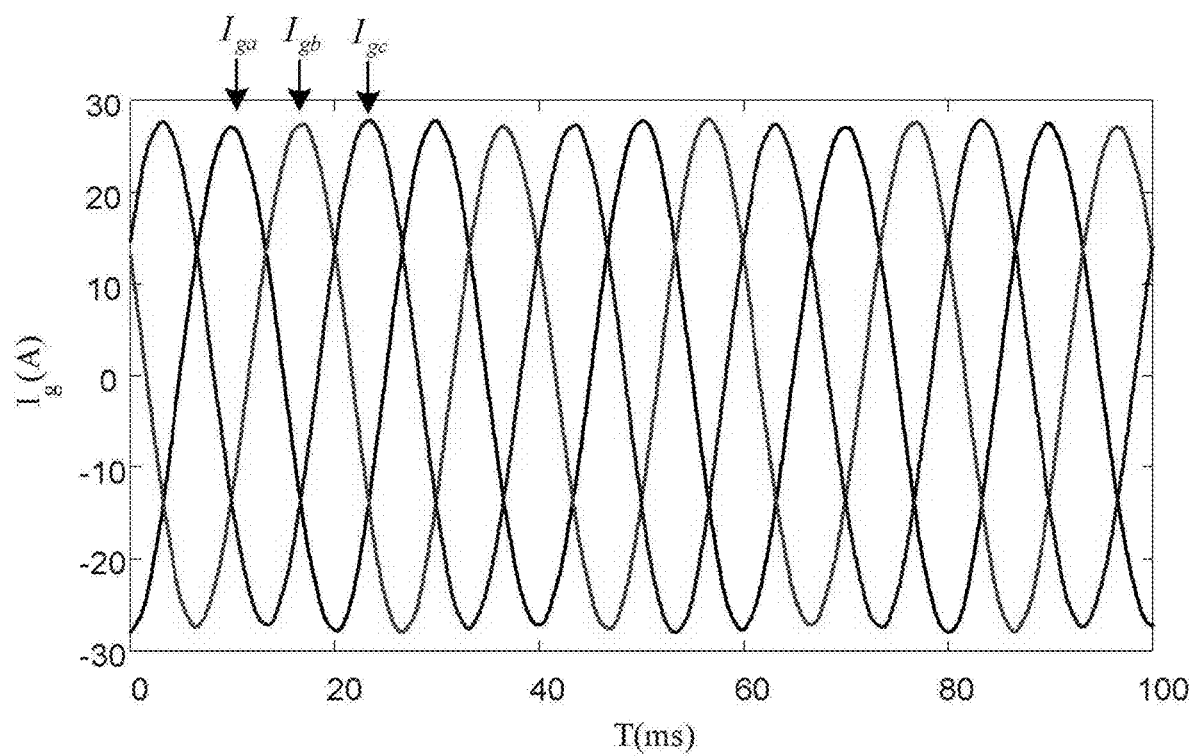
FIG. 20 is a schematic diagram of three-phase grid phase current waveform of series specific 385 Hz inter-harmonic compensator based on the PSR-SVPWM technique with T/6 as the sub-cycle.
Figure 21:
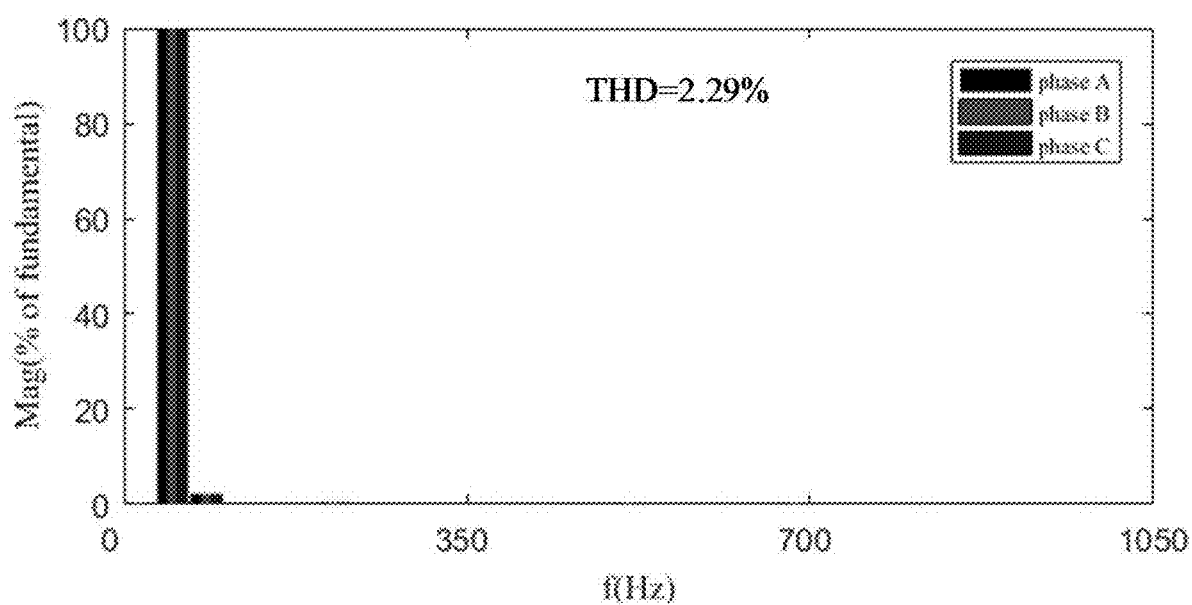
FIG. 21 is a schematic diagram of FFT analysis results of the three-phase grid phase current waveform based on the PSR-SVPWM technique with T/6 as the sub-cycle.

FIG. 20 shows the three-phase phase current waveform of the grid after series compensation based on the proposed PSR-SVPWM technique with T/6 as the sub-cycle. FIG. 21 shows its FFT analysis. It can be seen that the THD component of the phase current of the grid is greatly reduced, indicating that the inter-harmonic voltage in the grid is compensated quite well, and the inter-harmonic component with a frequency of 385 Hz is almost 0, so the compensation effect is great.

In the foregoing content, exemplary descriptions about the present invention are provided with reference to the accompanying drawings, and there is a plurality of changes and variations in structure and layout. Therefore, equivalent technical solutions also belong to the scope of the present invention, and all insubstantial improvements obtained by using the concept and solutions of the present invention fall within the protection scope of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optimal pulse width modulation (PWM) method based on frequency modulation for specific inter-harmonics, comprising the following steps:
   (1) selecting a specific inter-harmonic to be controlled to obtain an amplitude and phase information thereof;
   (2) selecting an appropriate modulated harmonic frequency and a number of fundamental cycles to calculate a frequency of the specific inter-harmonic to be controlled, an initial phase of a first sub-cycle and a phase increment;
   (3) in each of the fundamental cycles, the optimal PWM method is used to control an inverter to generate a specific harmonic output voltage whose amplitude and phase are modulated;
   (4) simultaneously, an initial phase of related harmonics is linearly modulated within a selected total fundamental period, resulting in certain a frequency offset, and harmonics are transferred to the specific inter-harmonic to be controlled, so that the inverter generates a desired specific inter-harmonic.

2. The optimal PWM method based on frequency modulation for specific inter-harmonics according to claim 1, wherein step (2) is as follows:
   (1) selecting a frequency of a modulated wave as $f_0$, the number of fundamental cycles r, then calculating the frequency offset Δf and the phase increment Δθ, Δf=$f_0$/r, Δθ=2π/r;
   (2) there are two kinds of modulation methods for selecting, and the harmonics in the PWM waveform within multiple fundamental periods is linearly phase-modulated by counterclockwise modulation or clockwise modulation.

3. The optimal PWM method based on frequency modulation for specific inter-harmonics according to claim 2, wherein step (3) is as follows:
   (1) positive or negative phase increments are determined by a selected modulation method, then a phase is modulated linearly in r sub-cycles;
   (2) extending the modulated waveform with r/$f_0$ as a cycle.

4. The optimal PWM method based on frequency modulation for specific inter-harmonics according to claim 3, applied to any of the following methods:
(1) using the PSR-PWM method based on an optimal partly unsymmetrical switching angle (OPUS) to control the inverter to generate the desired specific inter-harmonics;
(2) using the PSR-PWM method based on a space vector pulse width modulation (SVPWM) method to control the inverter to generate the desired specific inter-harmonics;
(3) using the PSR-PWM method based on a carrier modulation to control the inverter to generate the desired specific inter-harmonics.

5. The optimal PWM method based on frequency modulation for specific inter-harmonics according to claim 2, wherein the specific method of the step (2) is as follows:
(1) selecting the frequency of the modulated characteristic harmonic frequency as $f_0$, number of modulated fundamental sub-cycles r, then calculating the frequency offset $\Delta f$ and the phase increment $\Delta\theta$, and there are two characteristics as follows to be found:
① one modulated fundamental period is selected as a sub-cycle for the total period output waveform, selecting the characteristic harmonic frequency $f_h$ that is the closest to the desired inter-harmonic frequency $f_{ih}$, then calculating the frequency offset $\Delta f = f_{ih} - f_h$, if $f_h$ is divided by $\Delta f$ as an integer, $r = f_h/\Delta f$ and $\Delta\theta = 2\pi/r$; given $f_h$ is not divided by $\Delta f$ as an integer, then the irreducible fraction $f_h/\Delta f = m/n$ (m and n are coprime positive integers), the number of the sub-cycles is n and $\Delta\theta = 2\pi \cdot n/m$ by the PSR-PWM technique, theoretically, the frequency of an ideal inter-harmonic sinusoidal signal is continually controlled by the provided PSR-PWM, which is used for series or parallel inter-harmonic suppression, and so on;
② the frequency offset between any characteristic harmonic frequency and the desired closest inter-harmonic frequency is the same frequency spectrum offset by the PSR-PWM technique, wherein given that 10 fundamental sub-cycles are linearly modulated to control sub-harmonics which is less than 50 Hz or super-harmonics, the frequency spectrum offset is 5 Hz; similarly, the frequency spectrum offset of both controlled $5^{th}$ harmonic and $7^{th}$ harmonic respectively is also 5 Hz;
(2) the amplitude of the modulation waveform of PSR technique is calculated by the formula as follows ($a \in Z$):
amplitude characteristics of counterclockwise modulation:

$$|F_k| = \begin{cases} \frac{1}{2}\text{Sinc}\left[\left(1-\frac{1}{r}\right)\pi\right] & k=1 \\ \frac{1}{2}\left|\text{Sinc}\left[\left(a+\frac{1}{r}+1\right)\pi\right]\right| & k=ar+1 \quad (a \geq 1) \\ \frac{1}{2}\left|\text{Sinc}\left[\left(a-\frac{1}{r}-1\right)\pi\right]\right| & k=ar-1 \quad (a \geq 1) \end{cases}$$

amplitude characteristics of clockwise modulation:

$$|F_k| = \begin{cases} \frac{1}{2}\text{Sinc}\left[\left(1-\frac{1}{r}\right)\pi\right] & k=1 \\ \frac{1}{2}\left|\text{Sinc}\left[\left(a+\frac{1}{r}-1\right)\pi\right]\right| & k=ar+1 \quad (a \geq 1) \\ \frac{1}{2}\left|\text{Sinc}\left[\left(a-\frac{1}{r}+1\right)\pi\right]\right| & k=ar-1 \quad (a \geq 1) \end{cases}$$

wherein the function:

$$\text{Sinc}(x) = \frac{\sin(x)}{x};$$

(3) calculating the modulated initial phase angle $\theta_0$ of the specific inter-harmonic by the following formulas:
phase characteristics of counterclockwise modulation:

$$\angle F_k(\theta_0) = \begin{cases} \left(1-\frac{1}{r}\right)\pi + \theta_0 & k=1 \\ -\frac{1}{r}\pi + \theta_0 & k=ar+1 \quad (a \geq 1) \\ -\left(1-\frac{1}{r}\right)\pi - \theta_0 & k=ar-1 \quad (a \geq 1) \end{cases}$$

phase characteristics of clockwise modulation:

$$\angle F_k(\theta_0) = \begin{cases} \frac{1}{r}\pi + \theta_0 & k=r-1 \\ -\frac{1}{r}\pi + \theta_0 & k=ar+1 \quad (a \geq 0) \\ -\left(1-\frac{1}{r}\right)\pi + \theta_0 & k=ar-1 \quad (a \geq 2) \end{cases}$$

6. The optimal PWM method based on frequency modulation for specific inter-harmonics according to claim 2, wherein the step (3) is specifically as follows:
(1) after positive or negative phase increments are determined by the given formula, and the phase angle is modulated linearly in r sub-cycles in turn;
(2) extending a modulated waveform time period with $r/f_0$ as a total cycle;
(3) the PSR-PWM technique is suitable for any traditional PWM method with amplitude and phase control, comprising sine pulse width modulation (SPWM), space vector pulse width modulation (SVPWM), wavelet pulse width modulation (WPWM) and so on;
(4) the PSR-PWM technique is suitable for controlling two-level, three-level, and multi-level inverters to generate inter-harmonic voltage with any frequency in theory.

7. The optimal PWM method based on frequency modulation for specific inter-harmonics according to claim 2, applied to any of the following methods:
(1) using the PSR-PWM method based on an optimal partly unsymmetrical switching angle (OPUS) to control the inverter to generate the desired specific inter-harmonics;
(2) using the PSR-PWM method based on a space vector pulse width modulation (SVPWM) method to control the inverter to generate the desired specific inter-harmonics;

(3) using the PSR-PWM method based on a carrier modulation to control the inverter to generate the desired specific inter-harmonics.

8. The optimal PWM method based on frequency modulation for specific inter-harmonics according to claim 1, wherein the method controls one specific inter-harmonic or multiple specific inter-harmonics simultaneously.

9. The optimal PWM method based on frequency modulation for specific inter-harmonics according to claim 8, applied to any of the following methods:
   (1) using the PSR-PWM method based on an optimal partly unsymmetrical switching angle (OPUS) to control the inverter to generate the desired specific inter-harmonics;
   (2) using the PSR-PWM method based on a space vector pulse width modulation (SVPWM) method to control the inverter to generate the desired specific inter-harmonics;
   (3) using the PSR-PWM method based on a carrier modulation to control the inverter to generate the desired specific inter-harmonics.

10. The optimal PWM method based on frequency modulation for specific inter-harmonics according to claim 1, characterized in selectively realizing frequency shift by phase-shifting rotation pulse width modulation (PSR-PWM) technology, controlling a characteristic harmonic output of the inverter and move the characteristic harmonic output to the desired specific inter-harmonic; or moving the specific inter-harmonics to a desired characteristic harmonic; or moving some specific sub-harmonics or super-harmonics to a rated grid frequency.

11. The optimal PWM method based on frequency modulation for specific inter-harmonics according to claim 10, wherein through clockwise phase modulation or counter-clockwise phase modulation, minus or plus frequency spectrum offset between characteristic harmonic and the desired inter-harmonic is achieved.

12. The optimal PWM method based on frequency modulation for specific inter-harmonics according to claim 10, in the PSR-PWM technique, a fundamental period T is used as a modulation sub-cycle; or, one sixth of the fundamental period T/6 is used as the modulation sub-cycle; or, one twelfth of the fundamental period T/12 is used as the modulation sub-cycle.

13. The optimal PWM method based on frequency modulation for specific inter-harmonics according to claim 12, calculation formulas of three different numbers of sub-cycles $r_K$ and their modulated phase angle variables $\Delta\theta_K$ are provided separately, the subscript K presenting different types of modulation methods with different modulated sub-cycles with T, T/6, T/12;
   given the information of a specific inter-harmonic with its amplitude and initial phase angle and frequency, use each one of the above three methods for modulation, and the method comprising the following steps:
   (1) selecting the nearest adjacent frequency of inter-harmonic to a characteristic harmonic of a converter output voltage, and then calculating the number of modulated sub-cycles, to calculate a modulated phase angle variable of the first sub-cycle;
   (2) in each of the modulated sub-cycles, an initial phase angle of a relevant time period is linearly modulated with a phase angle variable in each modulated sub-cycle in turn, and then the selected characteristic harmonic is modulated to a desired inter-harmonic frequency spectrum by the obtained frequency offset.

14. The optimal PWM method based on frequency modulation for specific inter-harmonics according to claim 13, wherein T/6 is taken as a modulation sub-cycle, an initial phase of a signal is linearly modulated in each of the sub-cycles to obtain a desired frequency offset, thereby transforming the characteristic harmonic to the desired inter-harmonic in the total cycle;
   selecting a characteristic harmonic frequency $f_h$ that is the closest to the inter-harmonic frequency $f_{ih}$, then calculating the frequency offset $\Delta f = f_{ih} - f_h$, determine a value of $r_{T/6}$ according to $$\Delta f = f_0 \cdot \frac{6}{r_{T/6}}$$

and $\Delta\theta_{T/6} = 2\pi/r_{T/6}$.

15. The optimal PWM method based on frequency modulation for specific inter-harmonics according to claim 1, applied to any of the following methods:
   (1) using the PSR-PWM method based on an optimal partly unsymmetrical switching angle (OPUS) to control the inverter to generate the desired specific inter-harmonics;
   (2) using the PSR-PWM method based on a space vector pulse width modulation (SVPWM) method to control the inverter to generate the desired specific inter-harmonics;
   (3) using the PSR-PWM method based on a carrier modulation to control the inverter to generate the desired specific inter-harmonics.

\* \* \* \* \*